United States Patent
Seo

(10) Patent No.: US 9,178,026 B2
(45) Date of Patent: Nov. 3, 2015

(54) SEMICONDUCTOR DEVICES AND METHODS FABRICATING SAME

(71) Applicant: SAMSUNG ELECTRONICS CO., LTD., Suwon-Si, Gyeonggi-Do (KR)

(72) Inventor: Jungwoo Seo, Hwaseong-Si (KR)

(73) Assignee: Samsung Electronics Co., Ltd., Suwon-si, Gyeonngi-do (KR)

( * ) Notice: Subject to any disclaimer, the term of this patent is extended or adjusted under 35 U.S.C. 154(b) by 105 days.

(21) Appl. No.: 13/967,478

(22) Filed: Aug. 15, 2013

(65) Prior Publication Data

US 2014/0054659 A1 Feb. 27, 2014

(30) Foreign Application Priority Data

Aug. 22, 2012 (KR) .................. 10-2012-0091922

(51) Int. Cl.

| | |
|---|---|
| H01L 27/108 | (2006.01) |
| H01L 29/76 | (2006.01) |
| H01L 29/94 | (2006.01) |
| H01L 31/119 | (2006.01) |
| H01L 29/417 | (2006.01) |
| H01L 29/78 | (2006.01) |
| H01L 29/423 | (2006.01) |
| H01L 29/49 | (2006.01) |
| H01L 29/66 | (2006.01) |

(52) U.S. Cl.
CPC .... *H01L 29/41775* (2013.01); *H01L 27/10885* (2013.01); *H01L 27/10894* (2013.01); *H01L 27/10897* (2013.01); *H01L 29/4236* (2013.01); *H01L 29/4991* (2013.01); *H01L 29/66621* (2013.01); *H01L 29/78* (2013.01)

(58) Field of Classification Search
CPC ................. H01L 27/10885; H01L 27/10894; H01L 29/4236; H01L 27/108; H01L 29/78; H01L 21/764; H01L 29/66621; H01L 27/1158
USPC .......................................... 257/296, 303, 306
See application file for complete search history.

(56) References Cited

U.S. PATENT DOCUMENTS

| | | | |
|---|---|---|---|
| 5,869,374 A | 2/1999 | Wu | |
| 5,972,761 A | 10/1999 | Wu | |
| 5,994,730 A * | 11/1999 | Shrivastava et al. | .......... 257/306 |
| 6,548,362 B1 | 4/2003 | Wu | |
| 7,579,233 B2 | 8/2009 | Hwang | |
| 7,728,375 B2 | 6/2010 | Shin et al. | |
| 8,053,341 B2 | 11/2011 | Kim | |

(Continued)

FOREIGN PATENT DOCUMENTS

| | | |
|---|---|---|
| KR | 10-2004-0002234 A | 1/2004 |
| KR | 10-0549576 B1 | 2/2005 |

(Continued)

*Primary Examiner* — Thien F Tran
(74) *Attorney, Agent, or Firm* — Volentine & Whitt, PLLC

(57) ABSTRACT

Disclosed are semiconductor devices and methods of forming the same. According to the semiconductor device, gate structures are provided to be buried in a substrate and first dopant regions and second dopant regions are provided at both ends of the gate structures. Conductive lines cross the gate structures and are connected to the first dopant regions. Contact structures are respectively provided in contact holes which are provided between the conductive lines and expose the second dopant regions. The contact structures are in contact with the second dopant regions, respectively. Each of the contact structures includes a pad pattern extending along a sidewall of the contact hole.

17 Claims, 26 Drawing Sheets

(56) References Cited

U.S. PATENT DOCUMENTS

| | | |
|---|---|---|
| 8,084,326 B2 | 12/2011 | Kim |
| 2009/0140308 A1* | 6/2009 | Inoue et al. ................... 257/296 |
| 2011/0024811 A1 | 2/2011 | Kim |

FOREIGN PATENT DOCUMENTS

| | | |
|---|---|---|
| KR | 10-0653983 B1 | 11/2006 |
| KR | 10-2008-0001714 A | 1/2008 |

* cited by examiner

US 9,178,026 B2

SEMICONDUCTOR DEVICES AND METHODS FABRICATING SAME

CROSS-REFERENCE TO RELATED APPLICATIONS

This U.S. non-provisional patent application claims priority under 35 U.S.C. §119 to Korean Patent Application No. 10-2012-0091922, filed on Aug. 22, 2012, the subject matter of which is hereby incorporated by reference.

BACKGROUND

The inventive concept relates generally to semiconductor devices and methods of fabricating same.

Semiconductor devices are widely used in consumer electronics and computational systems because of their small size, varied functionality, and/or low manufacturing costs. The patterns, elements, electrically-connective signal lines, and related components used to implement contemporary semiconductor devices are very densely integrated on one or more substrates. Thus, the respective spacing(s) (e.g., the separating widths) between the constituent parts of semiconductor devices has been progressively reduced. Indeed, continuing demands for denser and denser semiconductor devices integration has necessitated the development of new (and expensive) exposure techniques in order to define ever more fine patterns.

However, there are practical limits associated with the reduction in size and increased integration density of semiconductor devices

SUMMARY

Embodiments of the inventive concept may provide semiconductor devices having improved electrical characteristics, and semiconductor devices having very dense integration.

In one embodiment, the inventive concept provides a semiconductor device comprising; a gate structure disposed on a substrate, a first dopant region and second dopant region disposed at opposing ends of the gate structure, a conductive line crossing the gate structure and electrically connected to the first dopant region, and a contact structure disposed in contact hole provided between the conductive lines and an exposed portion of the second dopant region, wherein the contact structure includes a pad pattern having a bottom portion and a pair of sidewall portions respectively extending from the bottom portion.

In another embodiment, the inventive concept provides a method of forming a semiconductor device comprising; forming first dopant region and second dopant region in a substrate on opposing ends of a gate structure extending between the first and second dopant regions, forming a conductive line crossing the gate structure, wherein the conductive line is electrically connected to the first dopant region, conformally forming a pad layer on the conductive line, forming a fence layer on the conductive line, and etching the fence layer to form a fence pattern crossing the conductive line, wherein the fence layer is etched using the pad layer as an etch stop layer.

In another embodiment, the inventive concept provides a method of forming a semiconductor device comprising; forming separate first and second dopant regions in a substrate, forming a gate structure that extends between the first and second dopant regions, forming a conductive line crossing the gate structure and electrically connected to the first dopant region, forming a contact structure in a contact hole provided between the conductive lines and an exposed portion of the second dopant region from a pad pattern having a bottom portion and a pair of sidewall portions respectively extending from the bottom portion, and forming a spacer structure disposed between the conductive line and contact structure, wherein the spacer structure includes an air gap.

BRIEF DESCRIPTION OF THE DRAWINGS

The inventive concept will be appreciated upon consideration of certain embodiments described hereafter with reference to the accompanying drawings.

DETAILED DESCRIPTION

Figure 1:
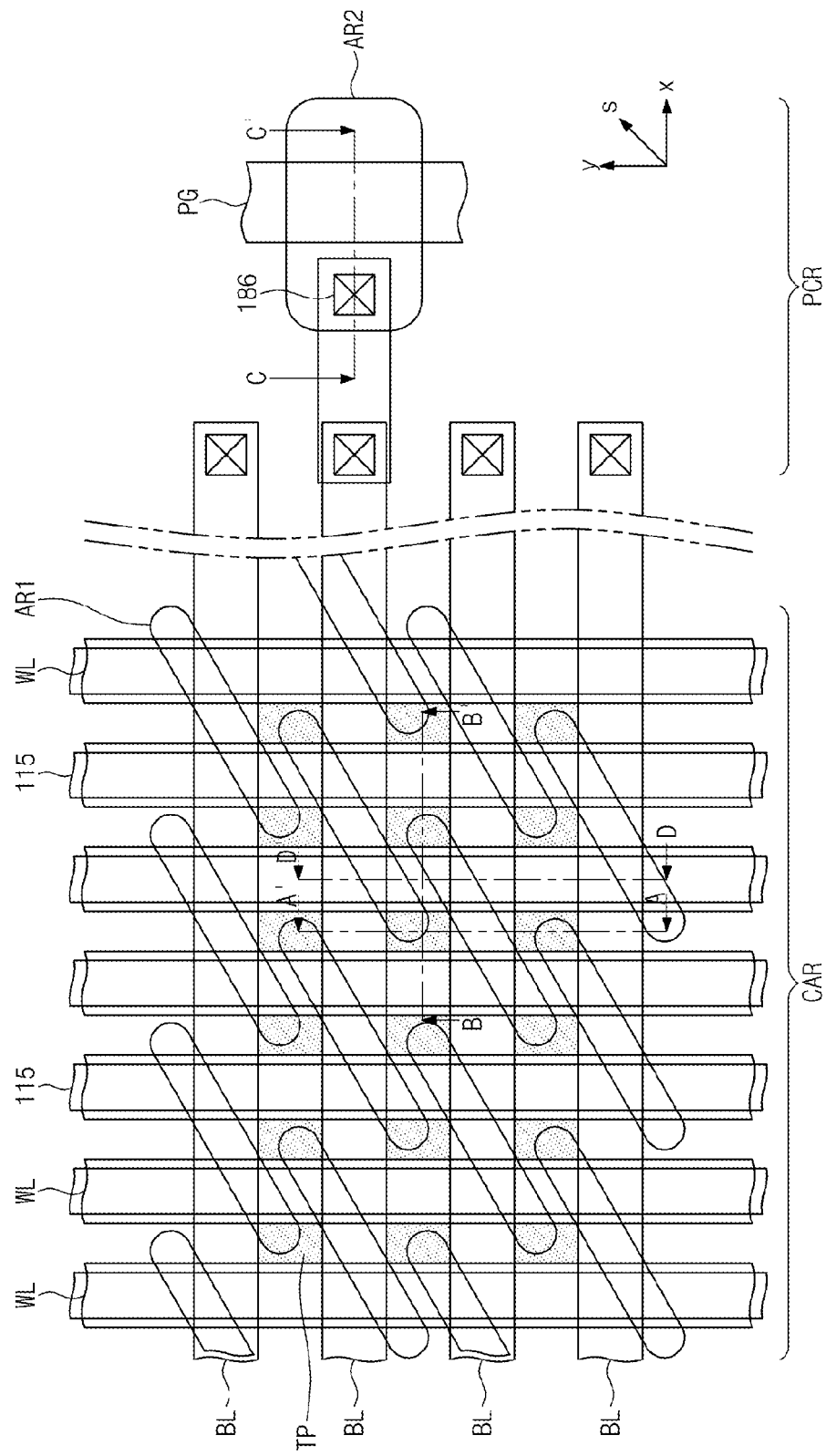
FIG. 1 is a plan view illustrating a semiconductor device according to certain embodiments of the inventive concept.

The inventive concept will now be described in some additional detail with reference to the accompanying drawings. The advantages and features of the inventive concept and methods of achieving them will be apparent from the following illustrated embodiments. It should be noted, however, that the inventive concept is not limited to only the illustrated embodiments, but may be implemented in various forms. Accordingly, the illustrated embodiments are provided to teach the making and use of the inventive concept to those skilled in the art. Throughout the written description and drawings, like reference numbers and labels are used to denote like or similar elements, features, and/or components.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof Embodiments of the inventive concept will be described according to certain cross-sectional views presented for clarity in the "ideal". Accordingly, the shapes of such exemplary views may be modified by practical manufacturing techniques and/or allowable manufacturing tolerances. Therefore, the embodiments of the inventive concept are not limited to only the specific region shapes illustrated in the drawings, but subsumes other shapes that may be created during manufacturing processes. Areas exemplified in the drawings have general properties, and are used to illustrate specific shapes of elements. Thus, this should not be construed as overly limiting of the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure (FIG. 1) is a plan view illustrating a semiconductor device according to certain embodiments of the inventive concept. The significance of cross-sectional lines A-A', B-B' and C-C' have been noted above in the brief description of the drawings.

Figure 2A:
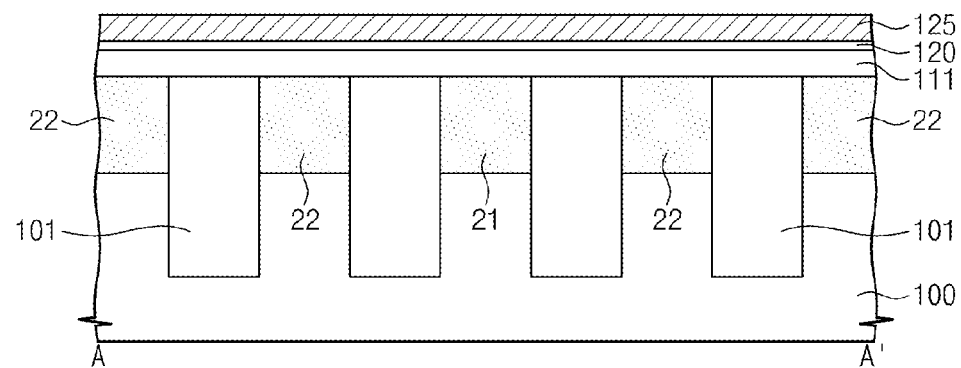
FIGS. 2A, 3A, 4A, 5A, 6A, 7A, 8A, 9A, 10A, 11A, 12A, 13A, 14A, 15A, 16A and 17A are respective cross-sectional views taken along line A-A' of FIG. 1 and each serves to further illustrate certain semiconductor device(s) and related methods of fabrication according to embodiments of the inventive concept.
Figure 2B:
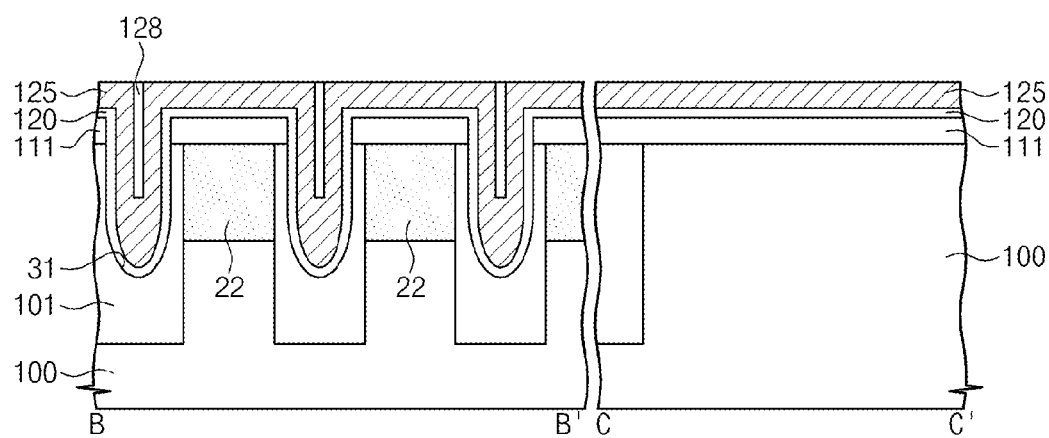
FIGS. 2B, 3B, 4B, 5B, 6B, 7B, 8B, 9B, 10B, 11B, 12B, 13B, 14B, 15B, 16B and 17B are respective cross-sectional views taken along lines B-B' and C-C' of FIG. 1 and each serves to further illustrate certain semiconductor devices and related methods of fabrication according to embodiments of the inventive concept.

Referring to FIGS. 1, 2A, and 2B, device isolation layers 101 may be formed in a substrate 100 to define first active regions AR1 in a cell array region CAR and a second active region AR2 in a peripheral circuit region PCR. In certain embodiments, the substrate 100 may be a semiconductor substrate formed of silicon, germanium, and/or silicon-germanium. Each one of the first active regions AR1 may have bar-shape (or an elongated island shape), and each first active region AR1 is spaced apart from other first active regions AR1 as shown, for example, in the plan view of FIG. 1. In FIG. 1, the illustrated "x-axis" will hereafter be arbitrarily designated as a "first direction" while the "y-axis" is designated a "second direction." In this descriptive context, each of the first active regions AR1 in a third direction that is not perpendicular to or parallel with either one of the first and second directions.

Dopant regions 21 and 22 may be formed in upper portions of the first active regions AR1. Dopant ions of a different conductivity type from the substrate 100 may be implanted into an upper portion of the substrate 100 to form the dopant regions 21 and 22. The dopant regions 21 and 22 may be formed after or before the formation of the device isolation layers 101. In certain embodiments, the dopant regions 21 and 22 will be formed in a subsequent process.

Trenches 31 may be formed in an upper portion of the substrate 100 of the cell array region CAR. The trenches 31 may extend in the y-axis direction and be spaced apart from each other in the x-axis direction. In each of the active regions AR1, a first dopant region 21 may be disposed between a pair of second dopant regions 22, and the first dopant region 21 and the second dopant regions 22 may be separated from each other by the trenches 31.

A mask pattern 111 may be formed on the substrate 100 and then a dry etching process and/or a wet etching process may be performed using the mask pattern 111 as an etch mask to form the trenches 31. For example, the mask pattern 111 may include at least one of a photoresist, a silicon nitride layer, and a silicon oxide layer. The depth of each one of the trenches 31 may be less than a depth of each one of the device isolation layers 101.

A first insulating layer 120, a conductive layer 125, and a filling layer 128 may be sequentially formed on the substrate 100 having the trenches 31. After the first insulating layer 120 and the conductive layer 125 may be formed in the trenches 31, the filling layer 128 may be formed to fill the trenches 31. The formation process of the filling layer 128 may include forming an insulating layer on the conductive layer 125 and then performing a planarizing process on the insulating layer.

For example, the first insulating layer 120 may include at least one of a silicon oxide layer, a silicon nitride layer, or a silicon oxynitride layer. The conductive layer 125 may include at least one of a doped semiconductor material, a conductive metal nitride, a metal, or a metal-semiconductor compound. The filling layer 128 may include a silicon oxide layer, a silicon nitride layer, or a silicon oxynitride layer. Each of the first insulating layer 120, the conductive layer 125, and the filling layer 128 may be a chemical vapor deposition (CVD) process, a physical vapor deposition (PVD) process, and/or an atomic layer deposition (ALD) process.

Figure 3A:
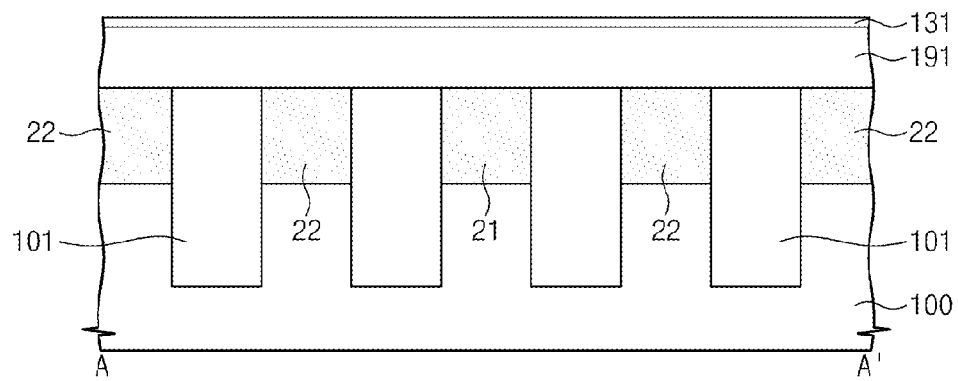
Figure 3B:
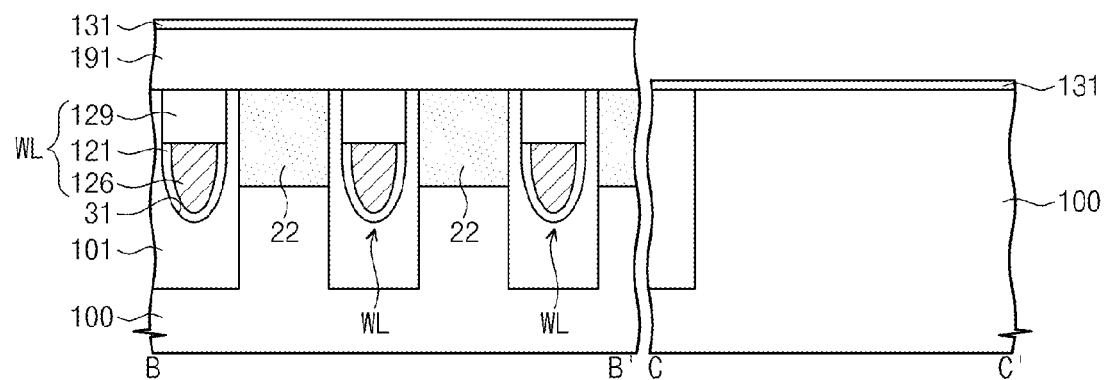

Referring to FIGS. 1, 3A, and 3B, the conductive layer 125 and the first insulating layer 120 may be etched to be confined. Due to the etching process, the first insulating layer 120 may be divided into gate insulating layers 121 separated from each other, and the conductive layer 125 may be divided into gate electrode 126 separated from each other. The etching process may be performed until the filling layer 128 is removed. Thus, top surfaces of the gate insulating layers 121 and the gate electrodes 126 may be formed to be lower than top ends of the trenches 31.

Gate capping patterns 129 may be formed on the gate electrodes 126, respectively. After an insulating layer is formed to fill the trenches 31 on the gate electrodes 126, the insulating layer may be planarized until a top surface of the substrate 100 is exposed, thereby forming the gate capping patterns 129. The gate capping patterns 129 may include at least one of a silicon nitride layer, a silicon oxide layer, or a silicon oxynitride layer. As a result, cell gate structures may be formed in the trenches 31, respectively. The cell gate structures may be word lines WL of the semiconductor device. Each of the word line WL may include the gate insulating layer 121, the gate electrode 126, and the gate capping pattern 129.

A second insulating layer 131 may be formed on the substrate 100 in the peripheral circuit region PCR. The second insulating layer 131 may include at least one of silicon oxide, silicon oxynitride, or a high-k dielectric having a dielectric constant greater than that of the silicon oxide. Before the second insulating layer 131 is formed, a mask pattern 191 may be formed to cover the cell array region CAR. The mask pattern 191 may not be formed in the peripheral circuit region PCR. For example, the mask pattern 191 may include at least one of a photoresist, a silicon nitride layer, or a silicon oxide layer. As illustrated in FIGS. 3A and 3B, the second insulating layer 131 of the cell array region CAR may be formed on the mask pattern 191.

Figure 4A:
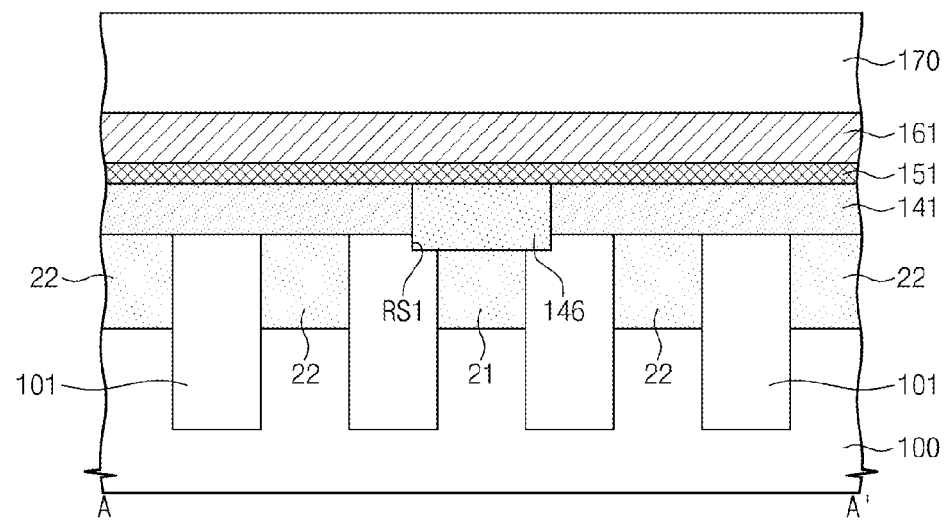
Figure 4B:
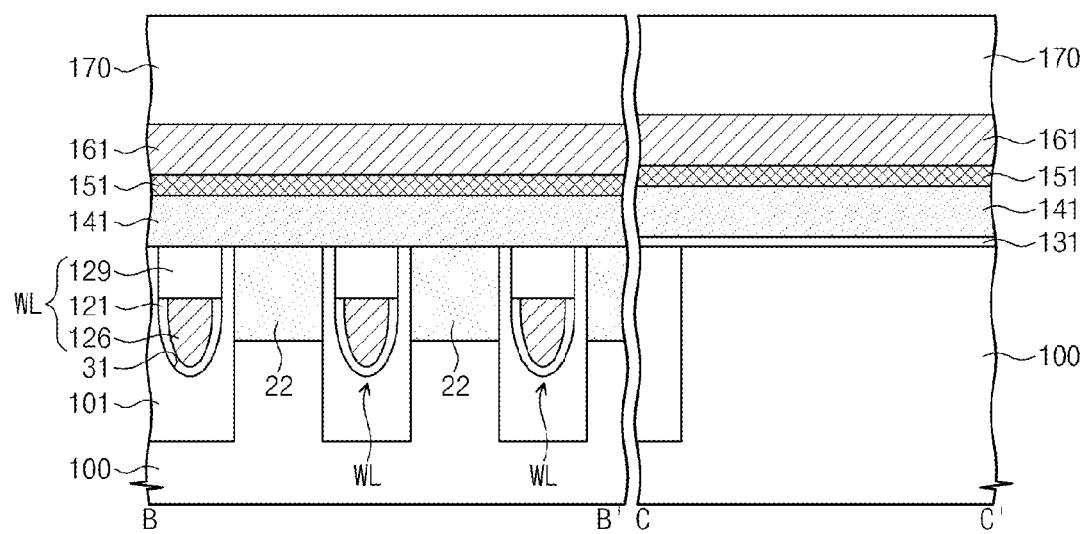

Referring to FIGS. 1, 4A, and 4B, the second insulating layer 131 and the mask pattern 191 in the cell array region CAR are removed, and then a first semiconductor layer 141 may be formed on the substrate 100 of the cell array region CAR and the peripheral circuit region PCR. For example, the first semiconductor layer 141 may include poly-crystalline silicon. First recess regions RS1 may be formed to penetrate the first semiconductor layer 141. The first recess regions RS1 may expose the first dopant regions 21, respectively. For example, the first recess region RS1 may have a circular shape or an elliptic shape as seen from the plan view. A mask pattern (not shown) may be formed on the first semiconductor layer 141 and then the first semiconductor layer 141 may be dry-etched and/or wet-etched using the mask pattern as an etch mask to form the first recess regions RS1. Bottom surfaces of the first recess regions RS1 may be lower than a bottom surface of the first semiconductor layer 141 by ever-etching.

Second semiconductor patterns 146 may be formed to fill the first recess regions RS1, respectively. For example, the second semiconductor patterns 146 may include poly-crystalline silicon. A conductivity type of the second semiconductor patterns 146 may be different from that of the first semiconductor layer 141. A second semiconductor layer may be formed to fill the first recess regions RS1 and then be planarized to form the second semiconductor patterns 146. The first semiconductor layer 141 in the peripheral circuit region PCR may be further doped with dopants according to a type (i.e., PMOS type or NMOS type) of a transistor of the peripheral circuit region PCR.

Subsequently, a barrier layer 151, a metal layer 161, and a capping layer 170 may be sequentially formed on the substrate 100 of the cell array and peripheral circuit regions CAR and PCR. The barrier layer 151 may include a metal-silicide layer and/or a metal-nitride layer on the metal-nitride layer. For example, the metal-silicide layer may include at least one of tungsten silicide (WSi), tantalum silicide (TaSi), or titanium silicide (TiSi). The metal-nitride layer may include at least one of tungsten nitride (WN), tantalum nitride (TaN), or titanium nitride (TiN).

The metal layer 161 may include at least one of tungsten (W), titanium (Ti), or tantalum (Ta). The capping layer 170 may include at least one of silicon oxide, silicon nitride, or silicon oxynitride. Each of the barrier layer 151, the metal layer 161, and the capping layer 170 may be formed by a sputtering process and/or a CVD process.

Figure 5A:
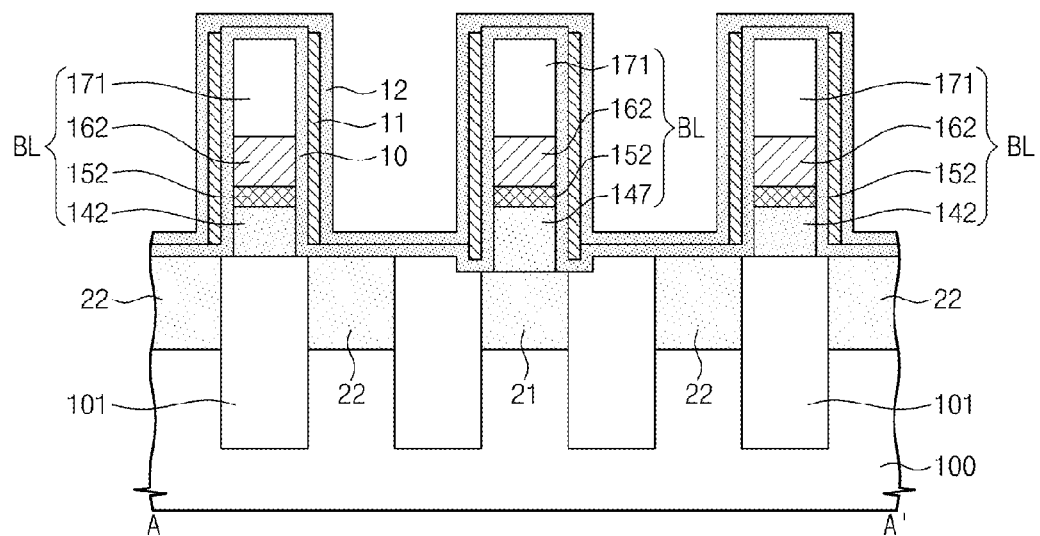
Figure 5B:
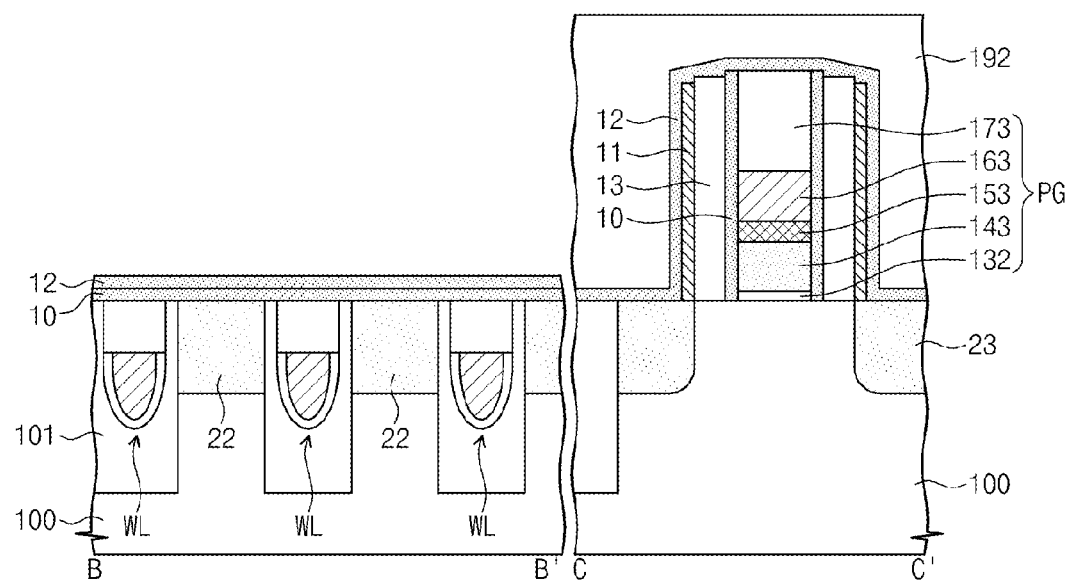

Referring to FIGS. 1, 5A, and 5B, the capping layer 170, the metal layer 161, the barrier layer 151, the second semiconductor patterns 146, and the first semiconductor layer 141 may be patterned to form conductive lines in the cell array region CAR and a peripheral gate structure PG in the peripheral circuit region PCR. The conductive lines in the cell array region CAR may be bit lines BL of the semiconductor device. Each of the bit lines BL may include a plurality of first conductive patterns 147, a barrier pattern 152, a second conductive pattern 162, and a capping pattern 171. The plurality of first conductive patterns 147 may be connected to the first dopant regions 21 arranged in a longitudinal direction of the bit line BL, respectively. The barrier pattern 152, the second conductive pattern 162, and the capping pattern 171 may be sequentially stacked on the plurality of first conductive patterns 147. The first semiconductor layer 141 may be formed into first semiconductor patterns 142 between the first conductive patterns 147 by the patterning process. Each of the bit lines BL may further include the first semiconductor patterns 142. In each of the bit lines BL, the first conductive patterns 147 and the first semiconductor patterns 142 may be alternately arranged under the barrier pattern 152 along the longitudinal direction (i.e., the x-direction) of the bit line BL.

The peripheral gate structure PG may include a gate insulating layer 132, a first conductive pattern 143, a barrier pattern 153, a second conductive pattern 163, and a capping pattern 173 which are sequentially staked on the substrate 100 in the peripheral circuit region PCR.

A first spacer 10 may be formed to cover sidewalls and top surfaces of the bit lines BL and the peripheral gate structure PG. A peripheral gate spacer 13 may be formed on the sidewall of the peripheral gate structure PG on which the first spacer 10 is formed. An insulating layer may be conformally formed on the substrate 100 having the first spacer 10 and then an anisotropic etching process may be performed on the insulating layer to form the peripheral gate spacer 13. The cell array region CAR may be covered by a mask before the formation of the insulating layer for the peripheral gate spacer 13. The first spacer 10 on the capping pattern 173 of the peripheral gate structure PG may be removed to expose the capping pattern 173 during the anisotropic etching process for the peripheral gate spacer 13. The peripheral gate spacer 13 may be locally formed in the peripheral circuit region PCR and may not be formed in the cell array region CAR.

A second spacer 11 and a third spacer 12 may be sequentially formed on the substrate 100 having the first spacer 10 and the peripheral gate spacer 13. An insulating layer may be conformally formed on the substrate 100 having the first spacer 11 and the peripheral gate spacer 13 and then an anisotropic etching process may be performed on the insulating layer to form the second spacer 11. An upper portion of the insulating layer for the second spacer 11 may be removed by the anisotropic etching process to expose the first spacer 10 on the bit line 10 and the capping pattern of the peripheral gate structure PG. The third spacer 12 may be substantially conformally formed on the first spacer 10.

The first and third spacers 10 and 12 may be formed of a material having an etch selectivity with respect to the second spacer 11. For example, the first and third spacers may include silicon nitride, and the second spacer 11 may include silicon oxide. The peripheral gate spacer 13 may include at least one of silicon oxide, silicon nitride, or silicon oxynitride. A mask pattern 192 may be formed to cover the peripheral circuit region PCR.

Figure 6A:
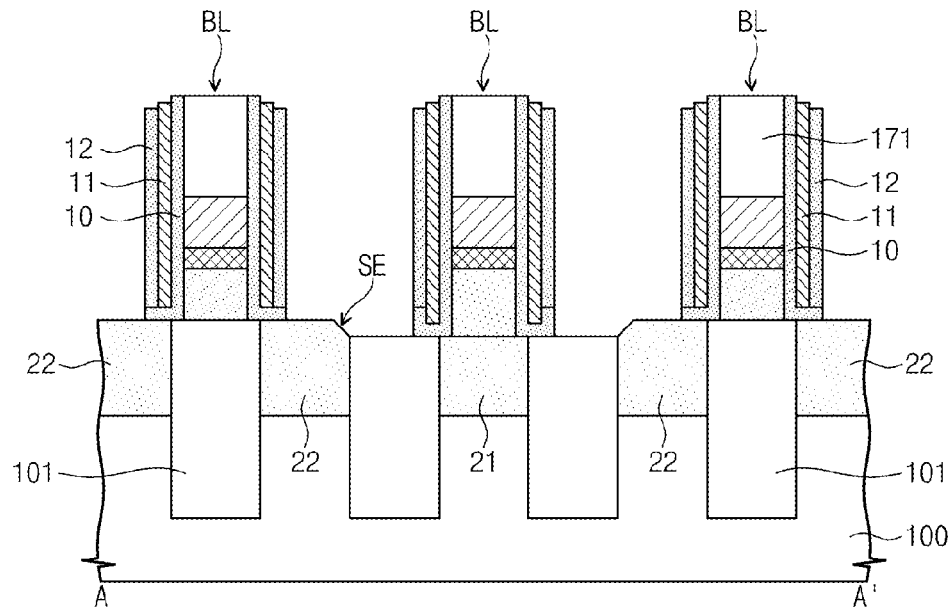
Figure 6B:
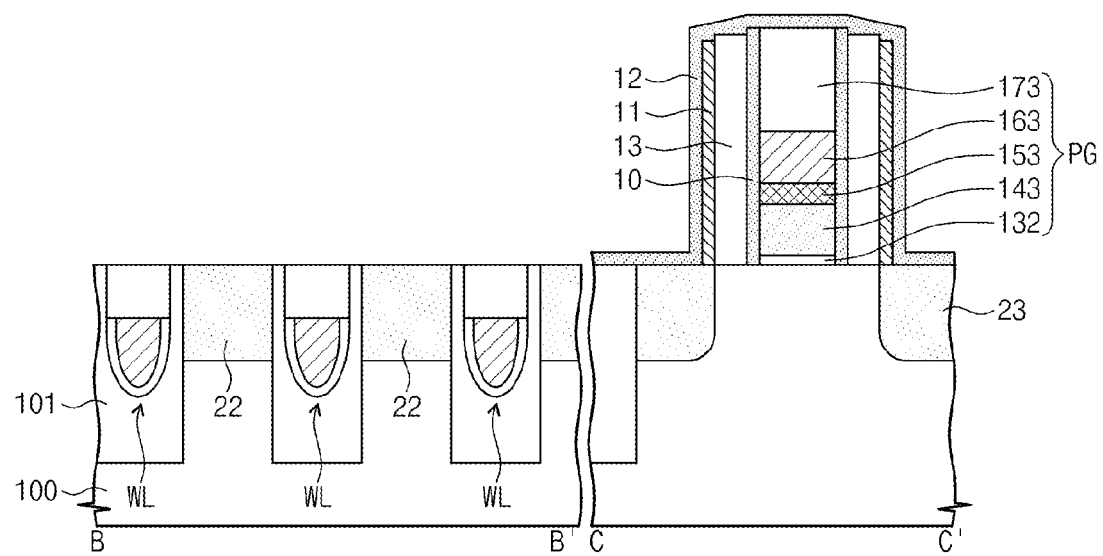

Referring to FIGS. 1, 6A, and 6B, an etching process may be performed using the mask pattern 192 as an etch mask. Due to the etching process, the first and third spacers 10 and 12 may be confinedly formed on a sidewall of each of the bit lines BL and the second dopant regions 22 may be exposed. The first and third spacers 10 and 12 on the bit line BL may be etched to expose the capping pattern 171 of the bit line BL by the etching process. A step SE may be formed between the second dopant region 22 and the device isolation layer 101 by the etching process. The step SE may be formed due to the bottom surface of the first recess region RS1 described with reference to FIGS. 4A and 4B. The step SE may not be vertical, but the step SE may be inclined. After the etching process is finished, the mask pattern 192 may be removed.

Figure 7A:
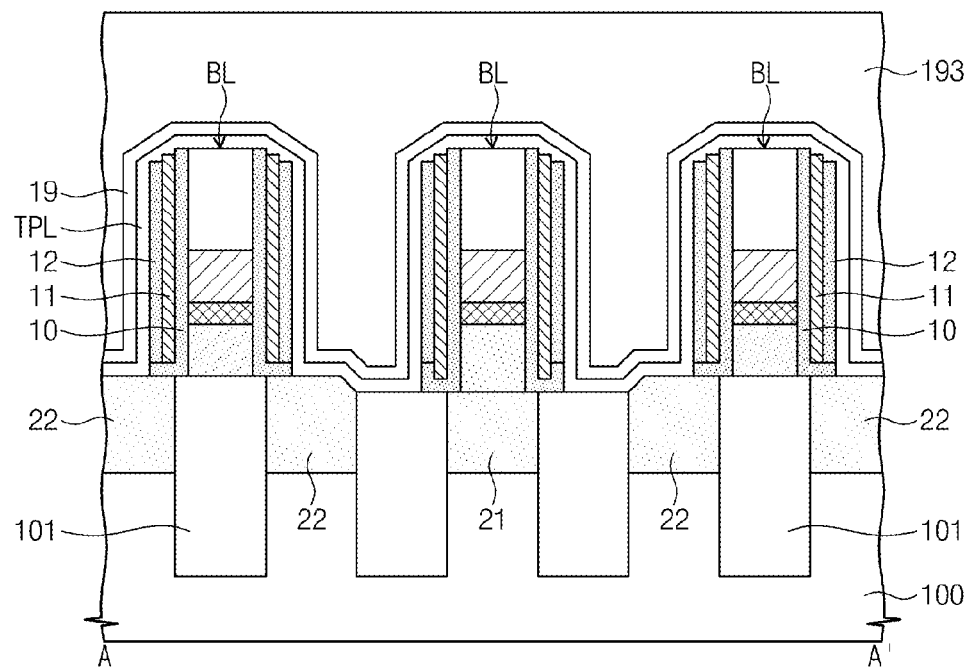
Figure 7B:
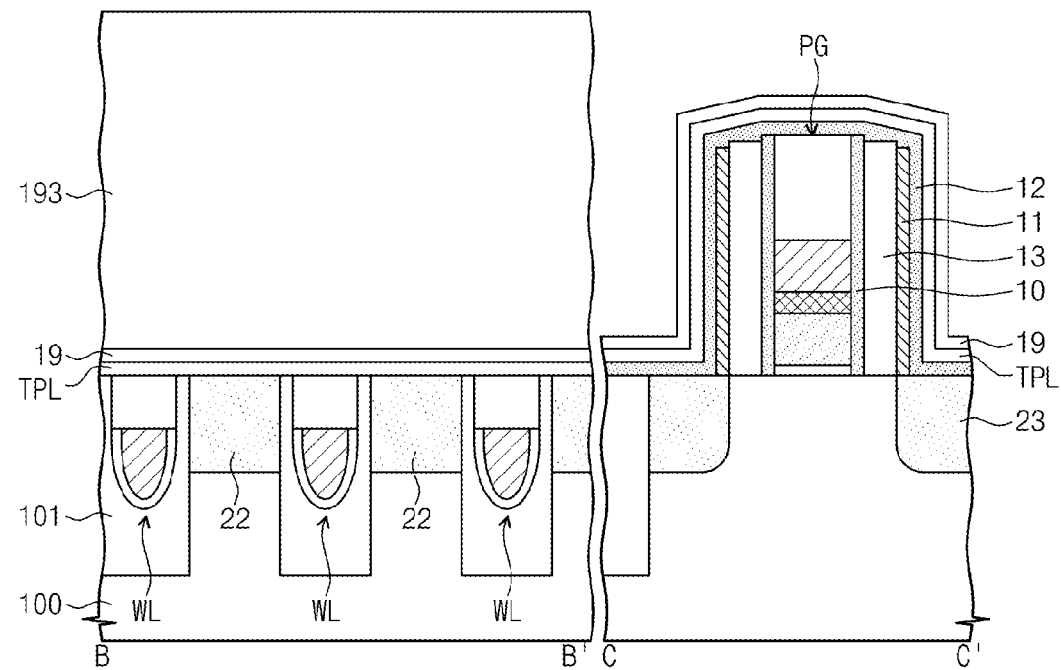

Referring to FIGS. 1, 7A, and 7B, a pad layer TPL and a protecting layer 19 may be sequentially formed on the bit lines BL and the peripheral gate structure PG. The pad layer TPL may be formed along the step SE between the bit lines BL. For example, the pad layer TPL may include poly-crystalline silicon or a metal. If the pad layer TPL includes a metal, the pad layer TPL may include at least one of titanium (Ti), tantalum (Ta), or tungsten (W). For example, the protecting layer 19 may include silicon oxide. A mask pattern 193 may be formed to cover the protecting layer 19 in the cell array region CAR.

Figure 8A:
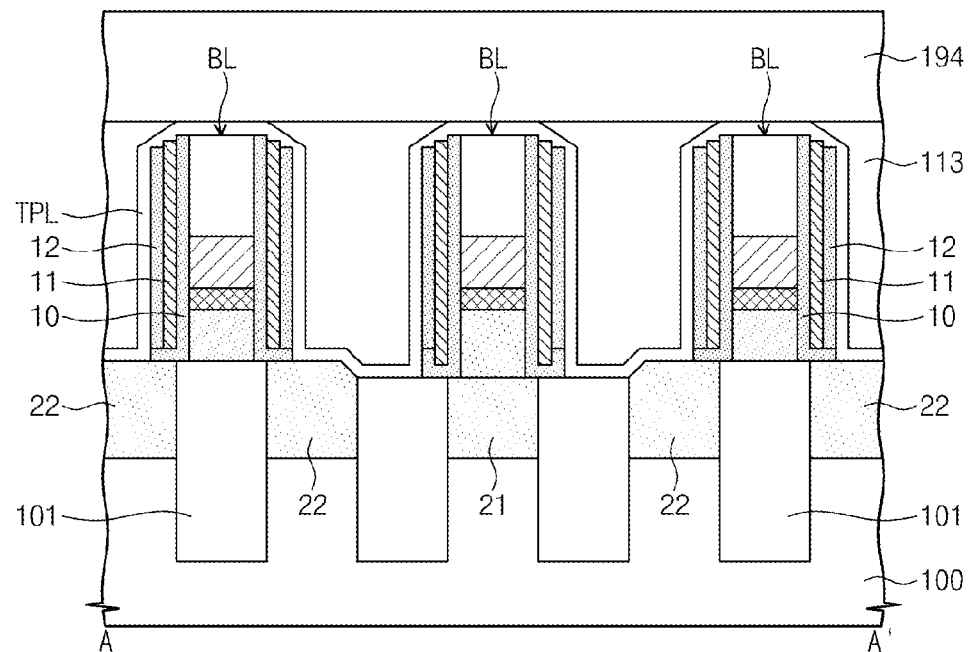
Figure 8B:
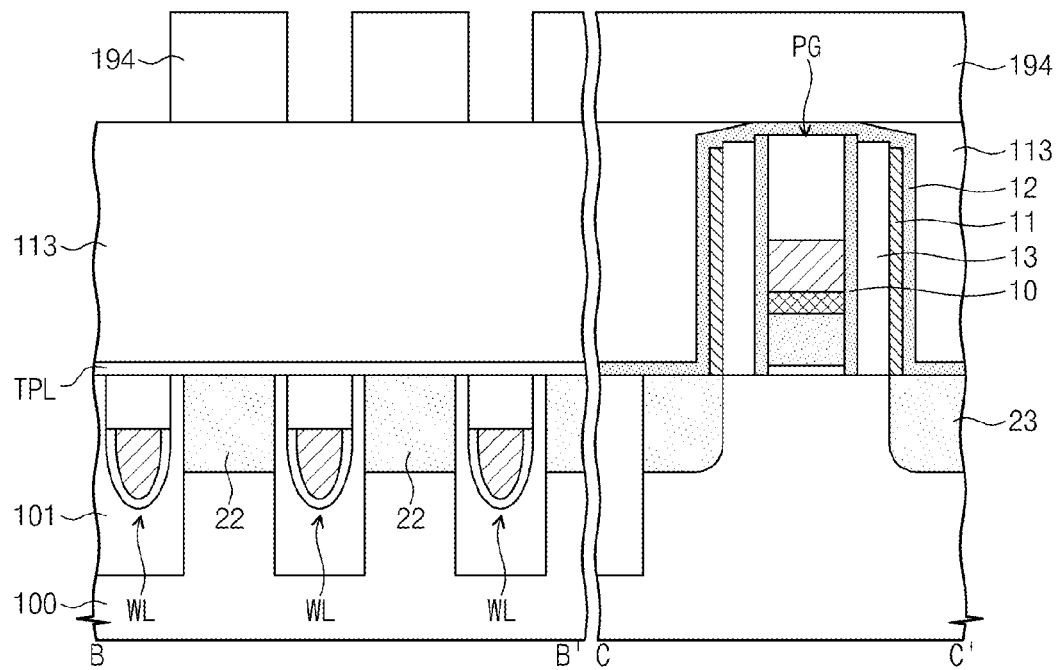
Figure 8C:
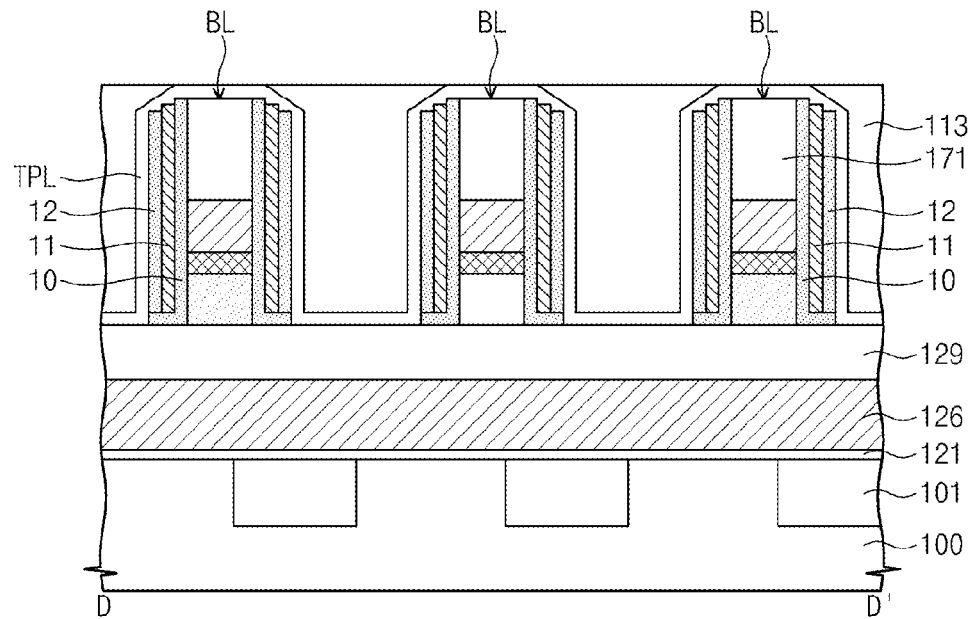
FIGS. 8C, 9C, 10C and 17C are respective cross-sectional views taken along line D-D' of FIG. 1 and each serves to further illustrate certain semiconductor devices and related methods of fabrication according to embodiments of the inventive concept.

Referring to FIGS. 1, 8A, 8B, and 8C, the protecting layer 19 of the peripheral circuit region PCR exposed by the mask pattern 193 may be removed and then the mask pattern 193 may be removed. FIG. 8C is a cross-sectional view taken along a line D-D' of FIG. 1. Subsequently, the pad layer TPL in the peripheral circuit region PCR may be removed using the protecting layer 19 remaining in the cell array region CAR as an etch mask. Thereafter, the protecting layer 19 in the cell array region CAR may be removed. The removal of the protecting layer 19 may be performed by a wet etching process. Likewise, the removal of the pad layer TPL may be performed by a wet etching process.

An interlayer insulating layer 113 may be formed on the substrate 100 in the cell array and peripheral circuit regions CAR and PCR. For example, the interlayer insulating layer 113 may include silicon oxide and/or silicon oxynitride. A formation process of the interlayer insulating layer 113 may include a planarizing process. Due to the planarizing process, the pad layer TPL on the top surface of the bit line BL may be exposed in the cell array region CAR. In other embodiments, the pad layer TPL on the top surface of the bit line BL may be removed by the planarizing process, so that the capping pattern 171 of the bit line BL may be exposed. Hereinafter, the exposed pad layer TPL on the top surface of the bit line will be described as an example for the purpose of ease and convenience in explanation. However, the inventive concept is not limited thereto. A mask pattern 194 may be formed on the interlayer insulating layer 113. The mask pattern 194 may include linear portions which extend in the y-axis direction and are spaced apart from each other in the x-axis direction. A portion of the mask pattern 194 in the peripheral circuit region PCR may cover the peripheral gate structure PG and the interlayer insulating layer 113.

Figure 9A:
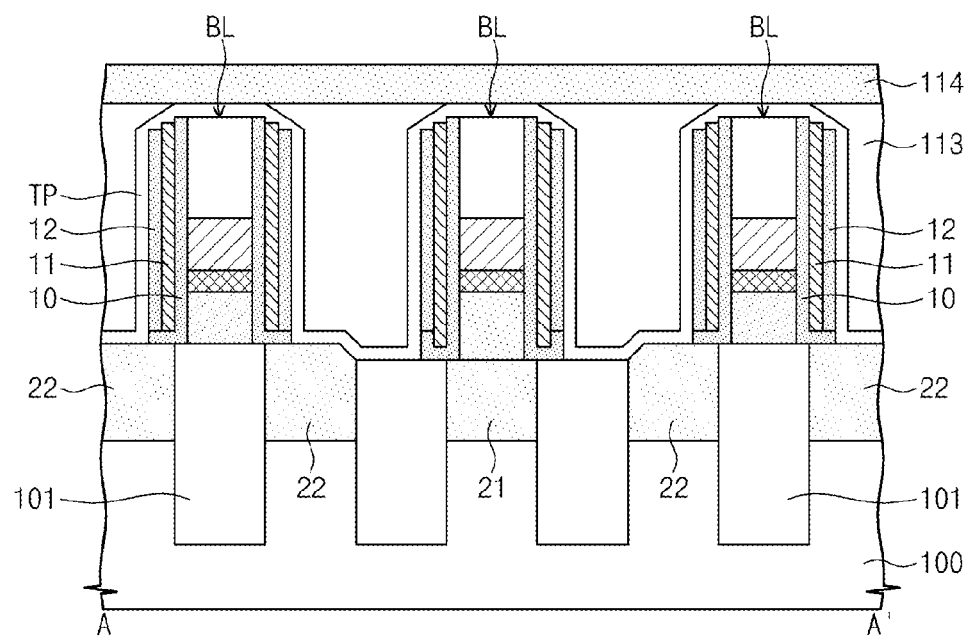
Figure 9B:
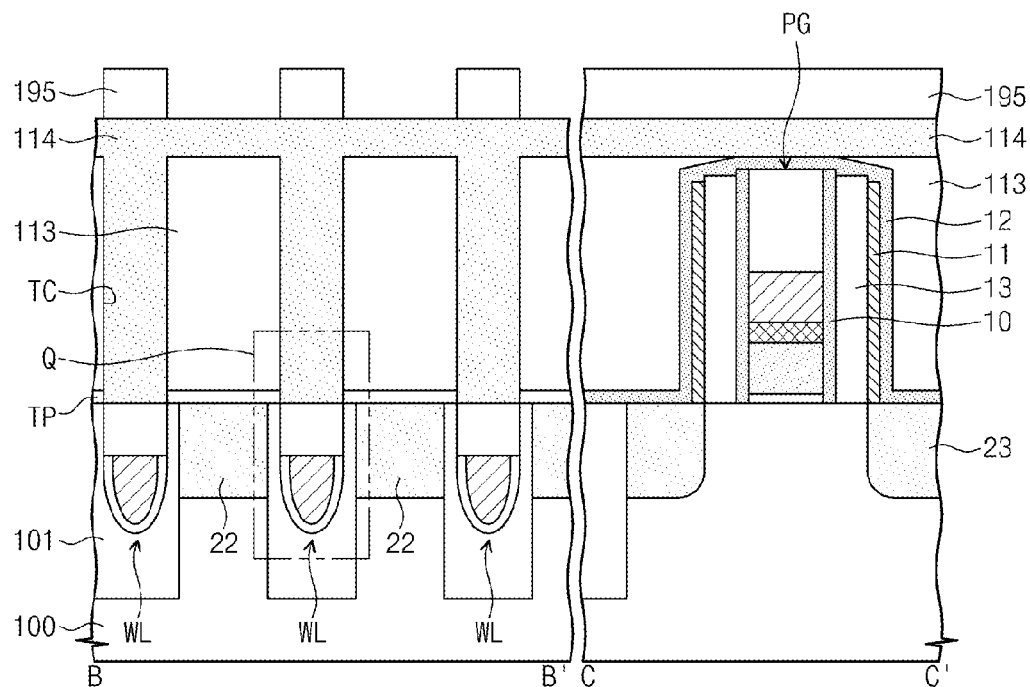
Figure 9C:
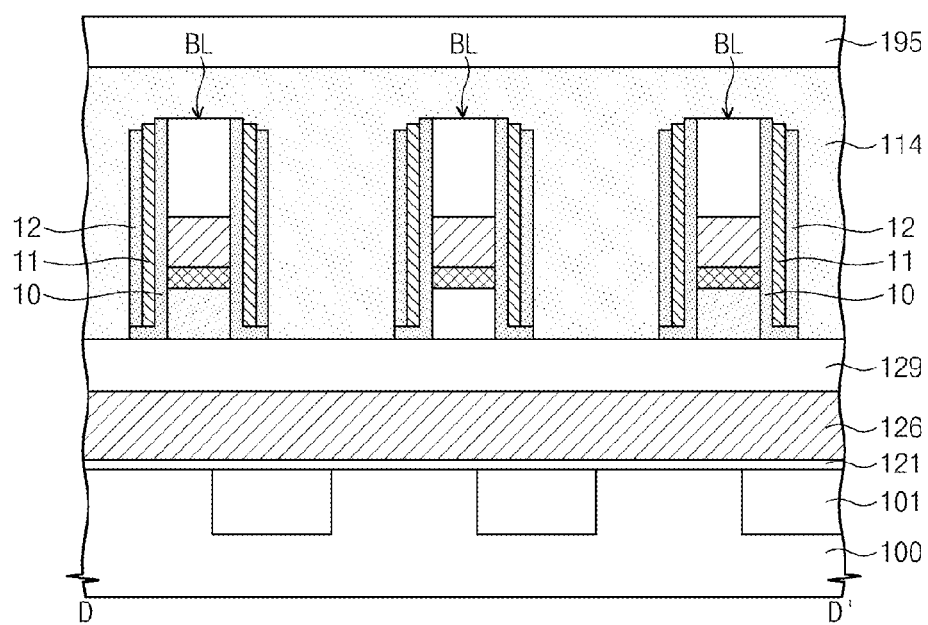

Referring to FIGS. 1, 9A, 9B, and 9C, the interlayer insulating layer 113 may be etched using the mask pattern 194 as an etch mask. FIG. 9C is a cross-sectional view taken along a line D-D' of FIG. 1. As a result, trenches TC exposing the word lines WL may be formed in the interlayer insulating layer 113. The etching process of the interlayer insulating layer 113 may be performed using the pad layer TPL as an etch stop layer. In other words, as illustrated in FIG. 9C, the pad layer TPL exposed by the mask pattern 195 between the bit lines BL may be used as the etch stop layer and then be removed. Thus, due to the pad layer TPL, it is possible to prevent the word lines WL from being damaged by ever-etching of the etching process. Since the etching process for the trenches TC is performed, the pad layer TPL may be divided into pad patterns TP separated from each other by the trenches TC.

A fence layer 114 may be formed to fill the trenches TC. For example, the fence layer 114 may include silicon oxynitride and/or silicon nitride. A mask pattern 195 may be formed on the fence layer 114. The mask pattern 195 may include linear portions extending along the word lines WL in the y-axis direction and spaced apart from each other in the x-direction in the cell array region CAR. A portion of the mask pattern 195 in the peripheral circuit region PCR may cover the peripheral gate structure PG and the interlayer insulating layer 113.

Figure 9D:
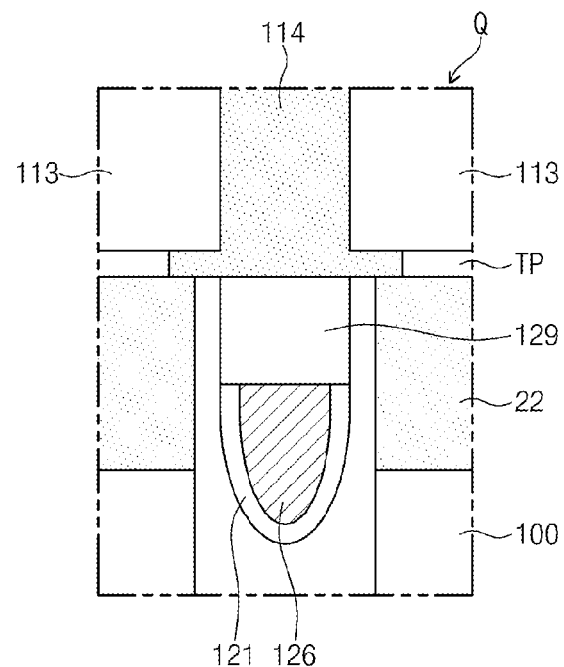
FIG. 9D is an enlarged view further illustrating region 'Q' of FIG. 9B.

FIG. 9D is an enlarged view further illustrating the region 'Q' of FIG. 9B. When the trenches TC are formed, sidewalls of the pad patterns TP may laterally etched in a direction horizontal to the top surface of the substrate 100. Thus, the fence layer 114 filling the trenches TC may extend between the interlayer insulating layer 113 and the top surface of the substrate 100. Alternatively, the sidewall of the pad pattern TP may be substantially coplanar with a sidewall of the interlayer insulating layer 113 constituting a sidewall of the trench TC as illustrated in FIG. 9B.

Figure 10A:
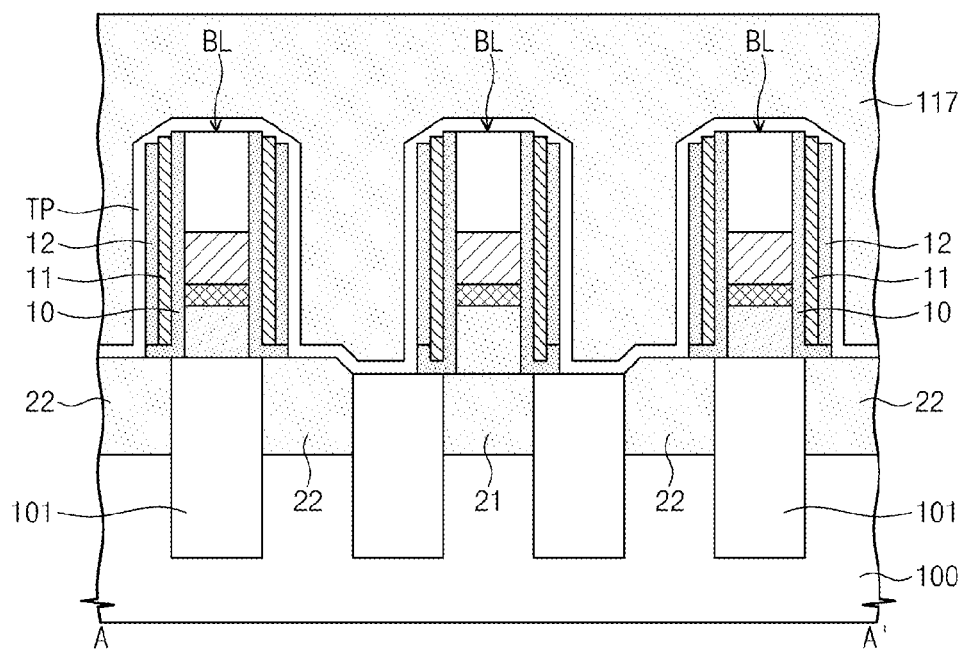
Figure 10B:
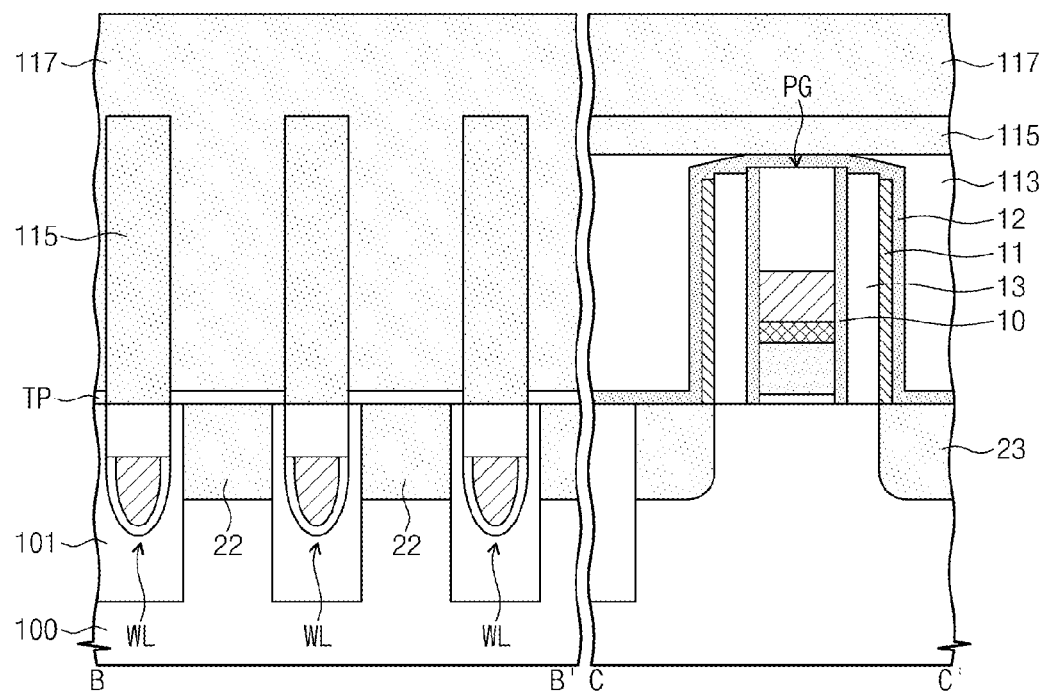
Figure 10C:
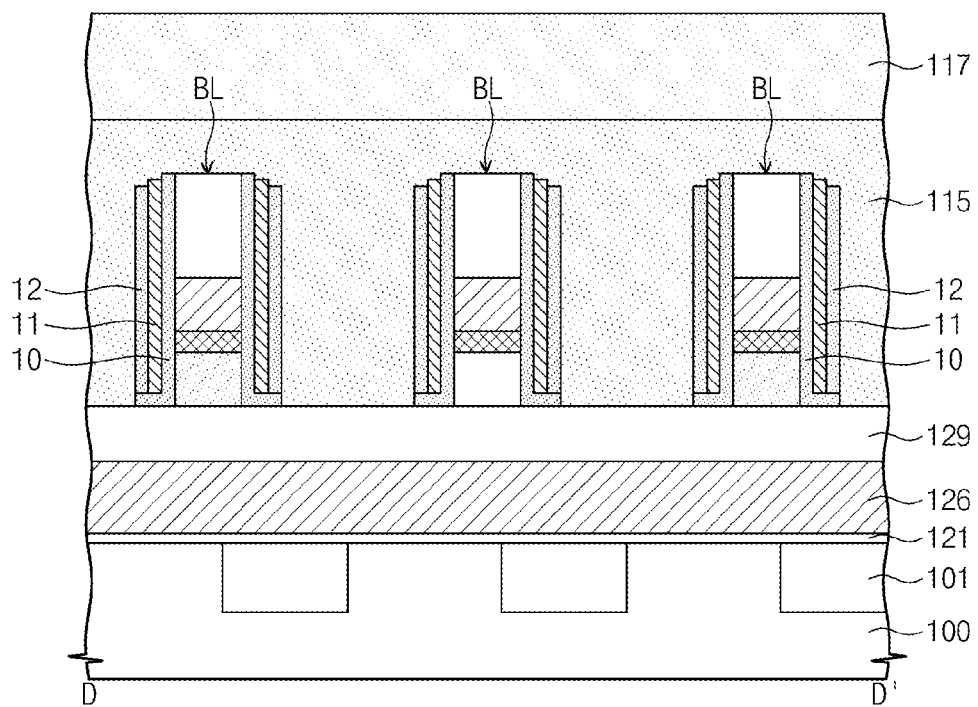

Referring to FIGS. 1, 10A, 10B, and 10C, the fence layer 114 may be patterned using the mask pattern 195 as an etch mask to form fence patterns 115. FIG. 10C is a cross-sectional view taken along a line D-D' of FIG. 1. The fence patterns 115 in the cell array region CAR may extend along the word lines WL in the y-axis direction and cross the bit lines BL. A portion of the fence patterns 115 may remain in the peripheral circuit region PCR. The portion of the fence patterns 115 may cover the peripheral get structure PG and the interlayer insulating layer 113 in the peripheral circuit region PCR. After the fence patterns 115 are formed, the interlayer insulating layer 113 in the cell array region CAR may be removed.

After the interlayer insulating layer 113 in the cell array region CAR is removed, a lower contact layer 117 may be formed. For example, the lower contact layer 117 may include a metal (e.g., titanium (Ti), tungsten (W), and/or a tantalum (Ta)) or poly-crystalline silicon. The lower contact layer 117 may be in contact with sidewalls of the fence patterns 115 which are exposed by the removal of the interlayer insulating layer 113 in the cell array region CAR.

Figure 11A:
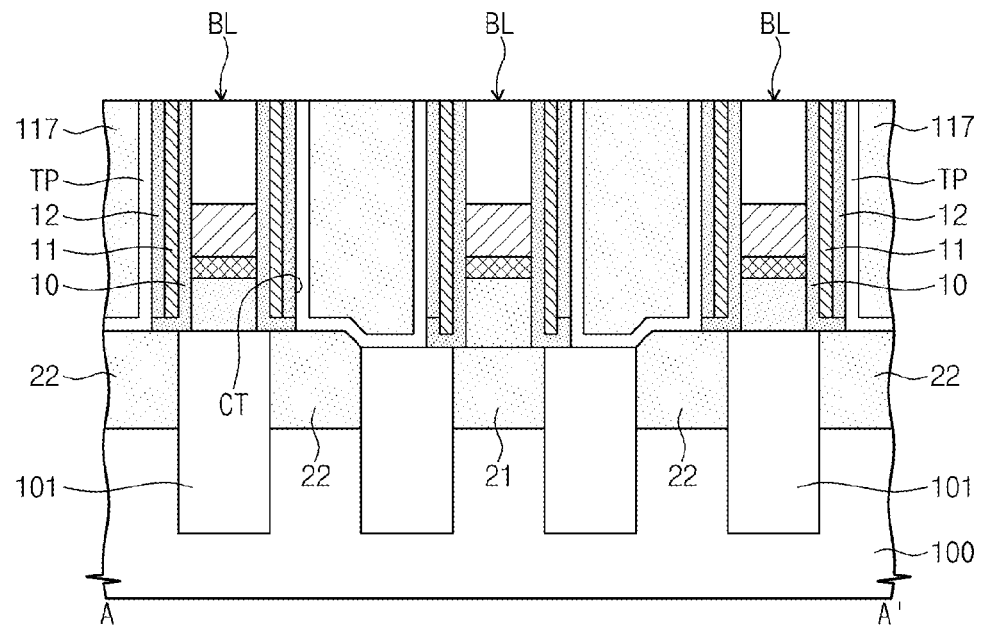
Figure 11B:
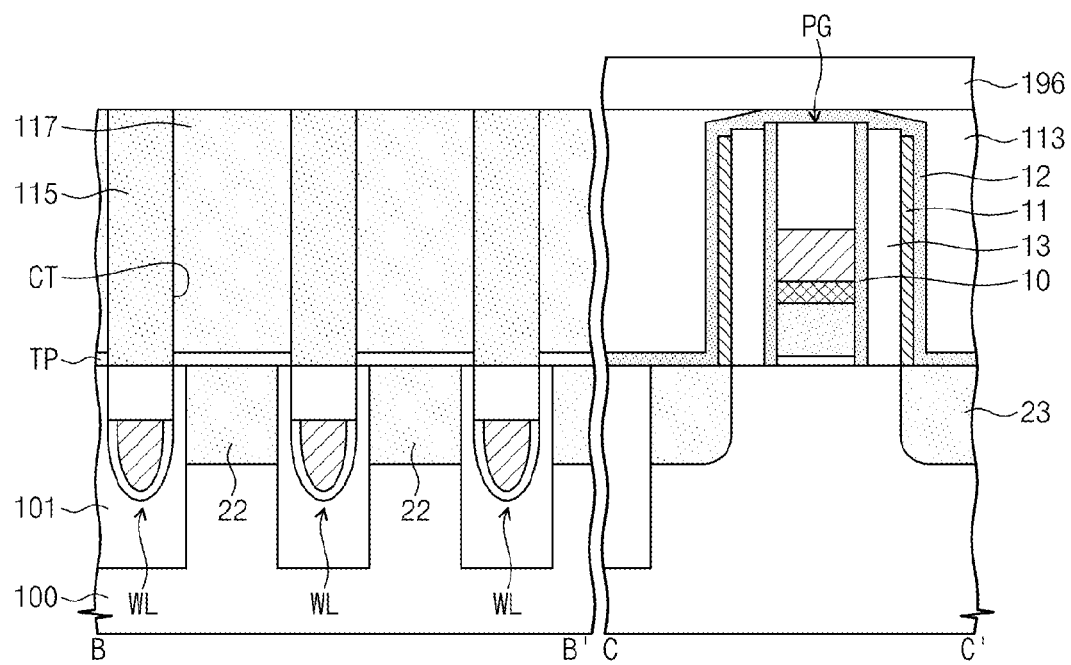

Referring to FIGS. 1, 11A and 11B, a planarizing process may be performed on a resultant structure including the lower contact layer 117. Thus, the lower contact layer 117 may be formed to be confined in each of contact holes CT. The interlayer insulating layer 113 in the peripheral circuit region PCR may be exposed by the planarizing process. Thereafter, a mask pattern 196 may be formed to cover the peripheral circuit region PCR.

Figure 12A:
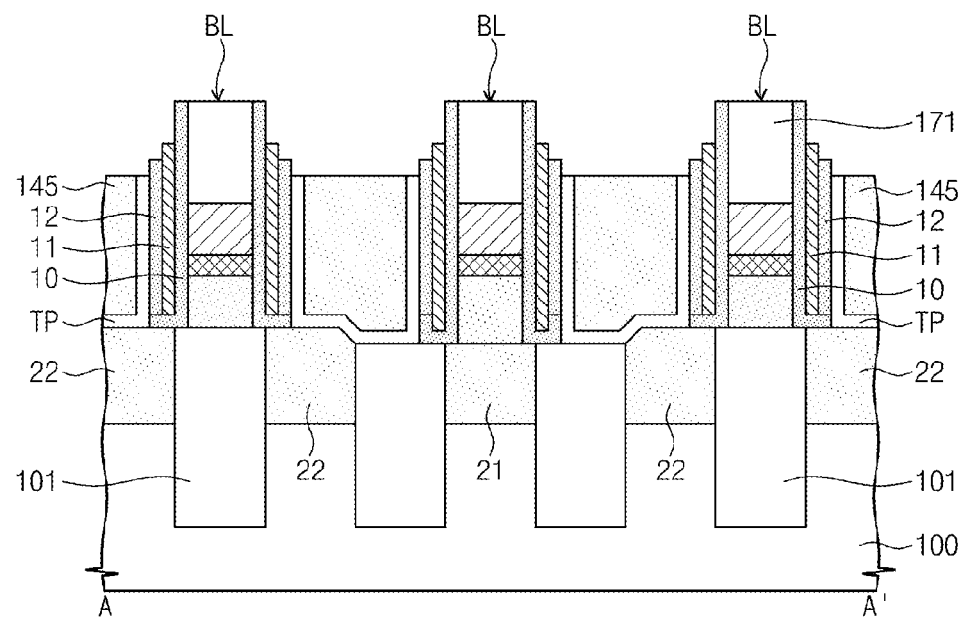
Figure 12B:
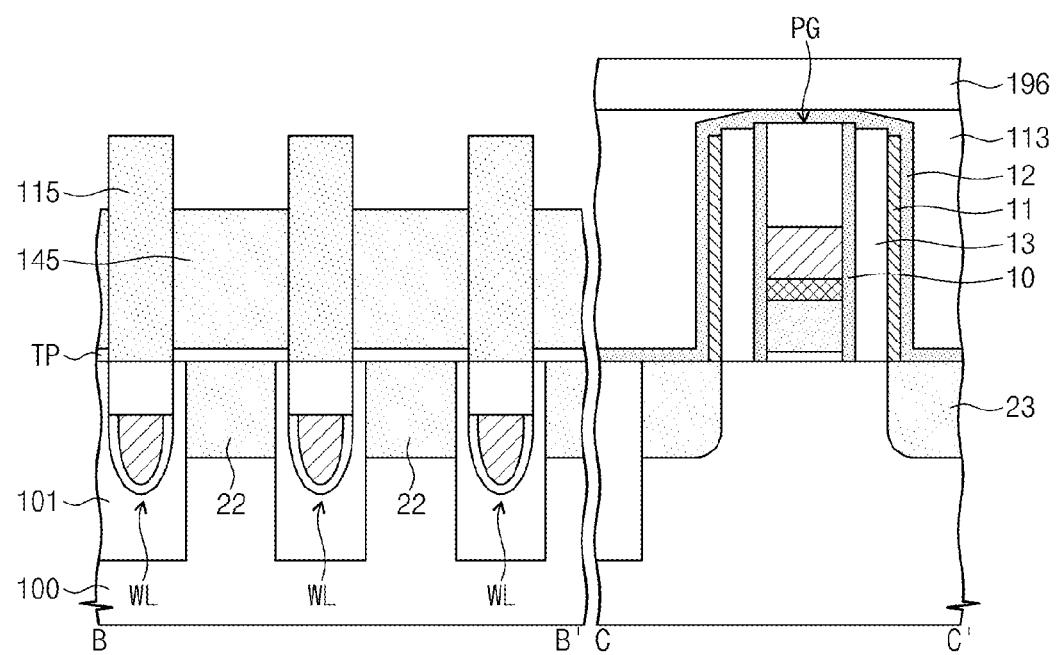

Referring to FIGS. 1, 12A, and 12B, upper portions of the pad pattern TP and the lower contact layer 117 in each of the contact holes CT may be etched using the mask pattern 196 as an etch mask. As a result, the lower contact layer 117 in each of the contact holes CT may be formed into a lower contact pattern 145. A top surface of the lower contact pattern 145 may be higher than a bottom surface of the capping pattern 171. Upper portions of the spacers 10, 11, and 12 between the bit lines BL and the pad patterns TP may also be etched by the etching process for the formation of the lower contact pattern 145, so that heights of the spacers 10, 11, and 12 may be gradually reduced from the bit line BL to the pad pattern TP.

Figure 13A:
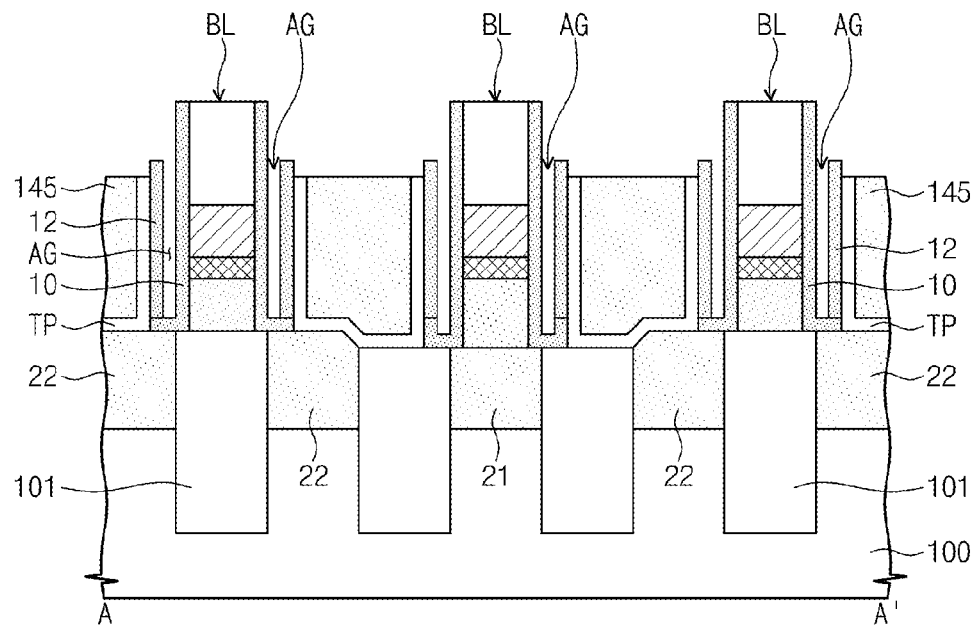
Figure 13B:
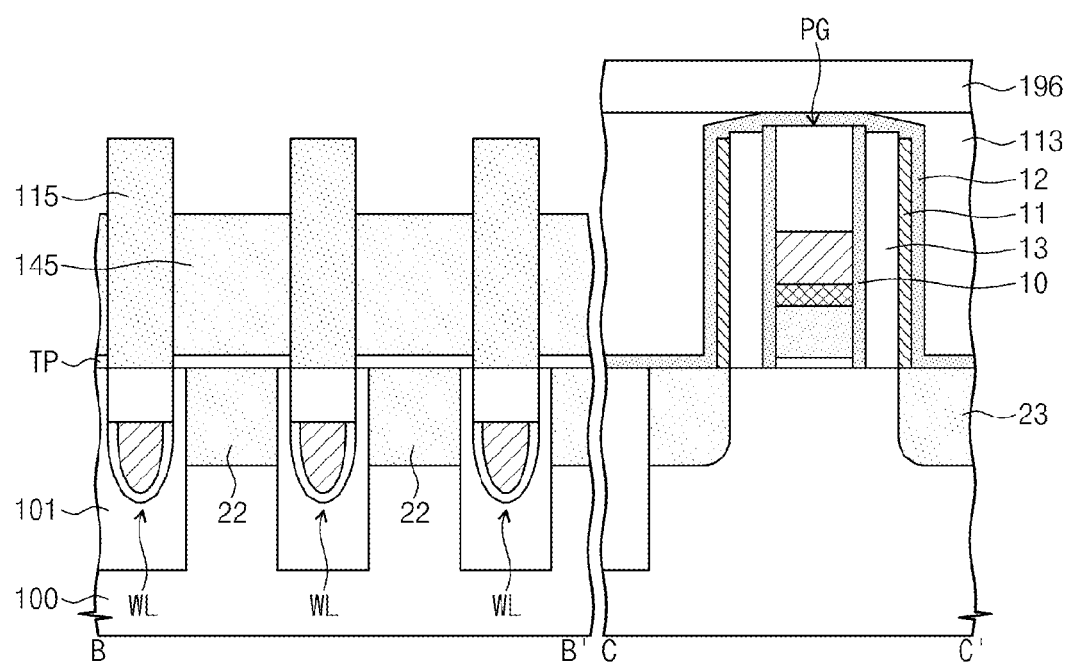

Referring to FIGS. 1, 13A, and 13B, the second spacer 11 may be selectively removed from the cell array region CAR. The selective removal process of the second spacer 11 may include a wet etching process. Due to the removal of the second spacer 11, an air gap AG may be formed between the first spacer 10 and the third spacer 12. The air gap AG may be a region in which a solid phase material is not provided. In other words, the air gap AG may be a substantially empty space.

Figure 14A:
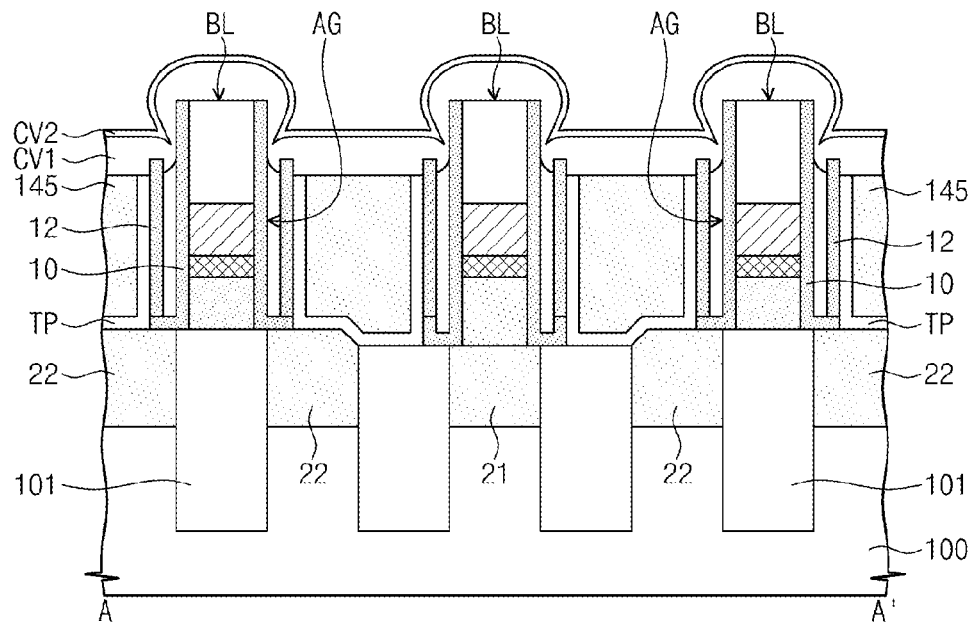
Figure 14B:
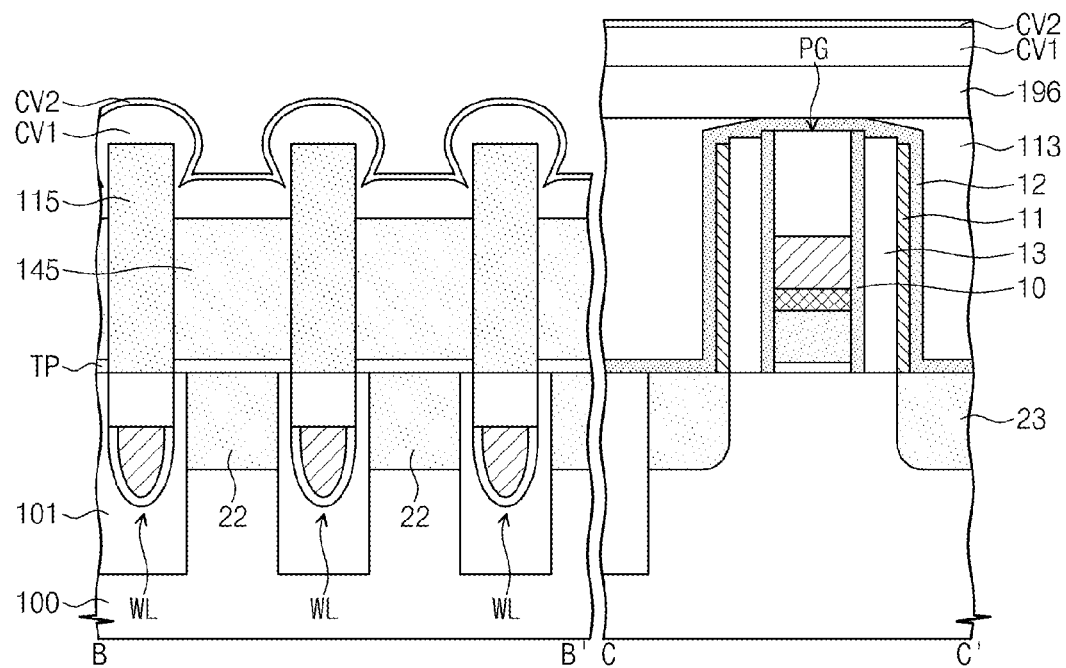

Referring to FIGS. 1, 14A, and 14B, a first cover layer CV1 and a second cover layer CV2 may be sequentially formed a resultant structure having the air gap AG. The air gap AG may be covered by the cover layers CV1 and CV2. The first cover layer CV1 may not fill the air gap AG. For example, the first cover layer CV1 may be formed of a material having relatively poor step coverage. On the contrary, the second cover layer CV2 may be formed of a material having relatively good step coverage. As described above, the first cover layer CV1 may not fill the air gap AG. Alternatively, the first cover layer CV1 may partially fill the air gap AG. For example, each of the first cover layer CV1 and the second cover layer CV2 may include a silicon nitride layer and/or a silicon oxynitride layer.

Figure 15A:
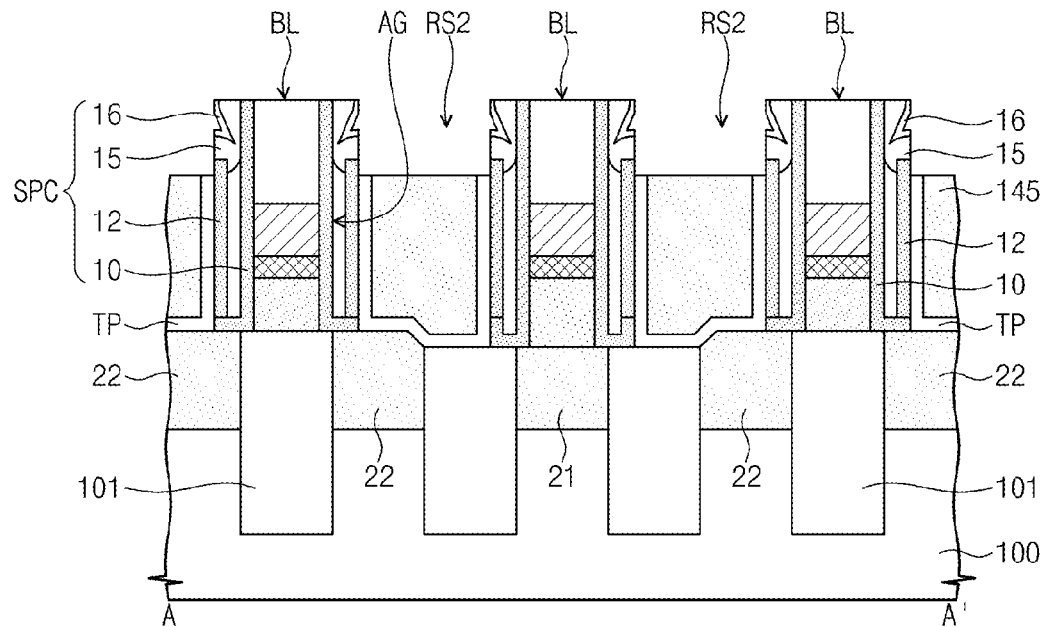
Figure 15B:
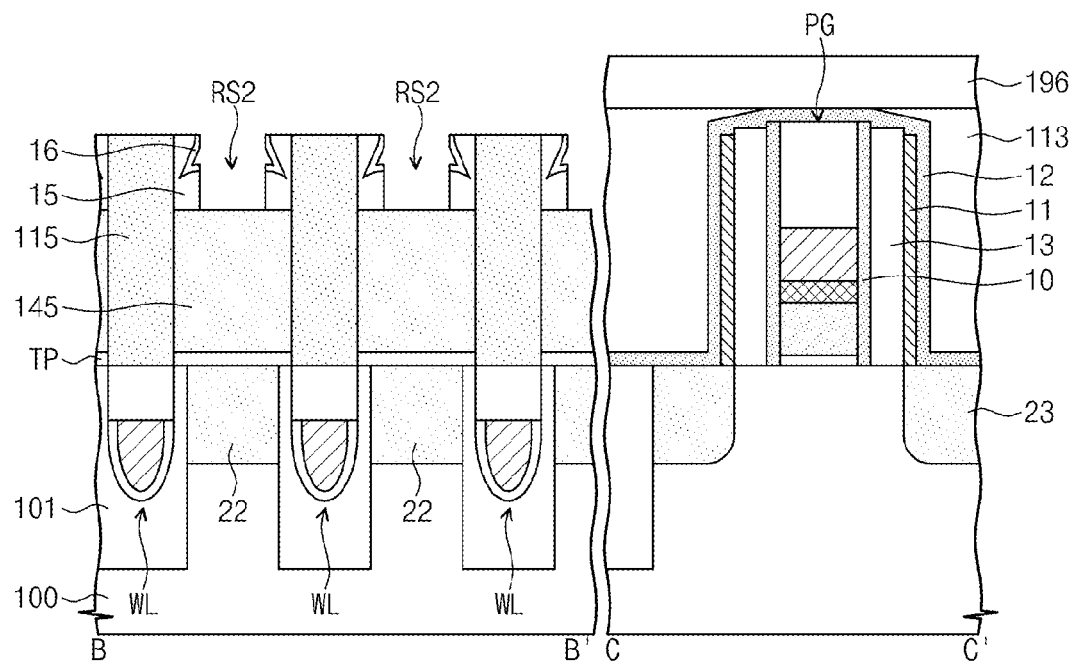

Referring to FIGS. 1, 15A, and 15B, an etching process may be performed on the second and first cover layers CV2 and CV1 to form a fourth spacer 15 and a fifth spacer 16 on each sidewall of each bit line BL. As a result, a spacer structure SPC including the first, third, fourth, and fifth spacers 10, 12, 15, and 16 may be formed on the sidewall of the bit line BL. Second recess regions RS2 may be formed to respectively expose top surfaces of the lower contact patterns 145 by the etching process performed on the second and first cover layers CV2 and CV1. During the etching process, upper portions of the fence patterns 115 and upper portions of the lower contact patterns 145 may be etched together.

Figure 16A:
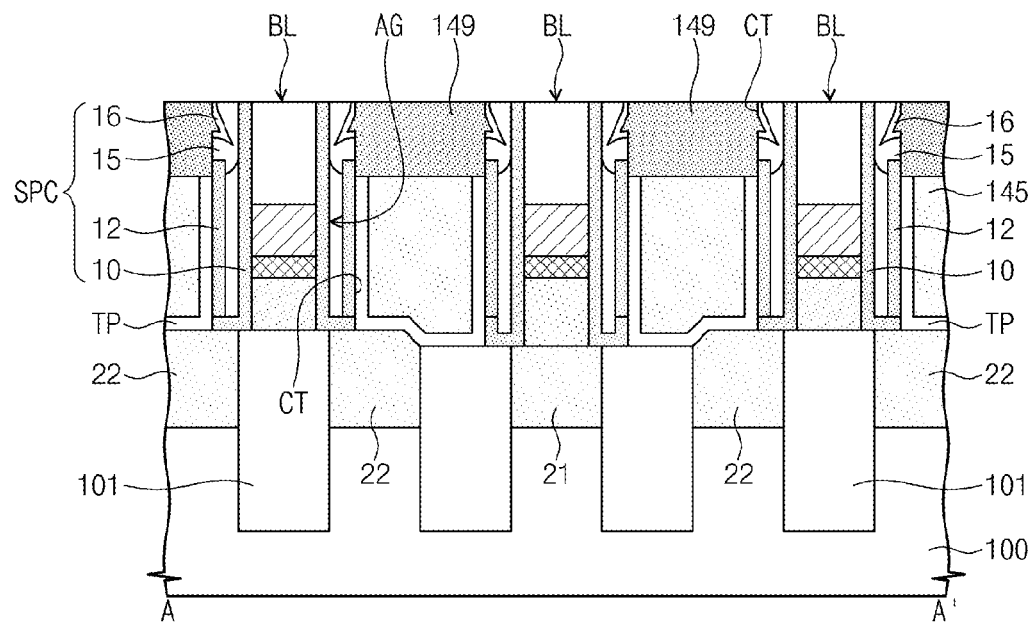
Figure 16B:
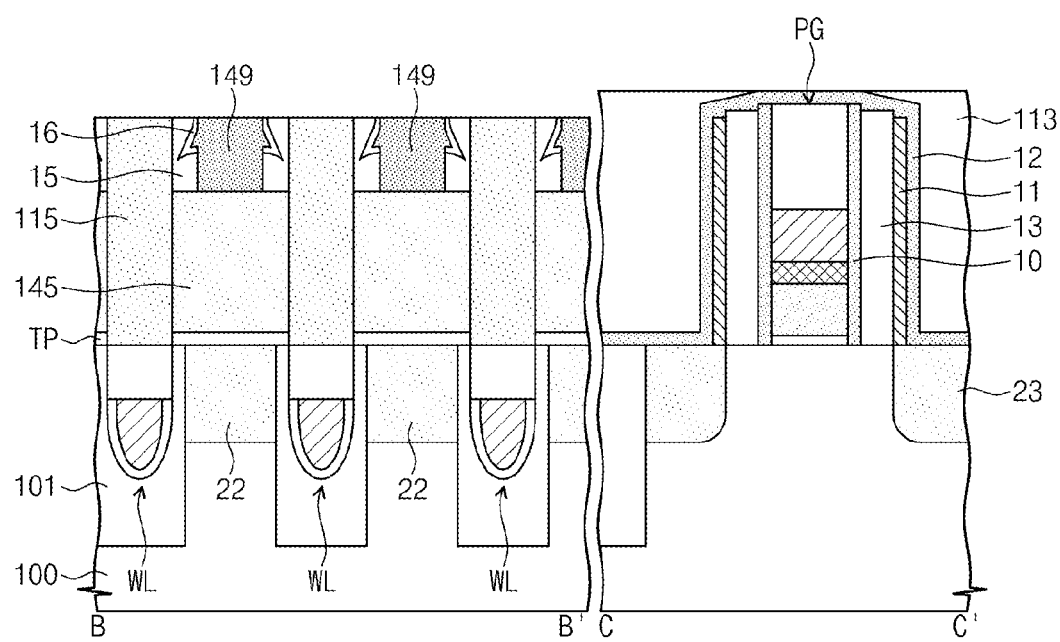

Referring to FIG. 1, 16A, and 16B, upper contact patterns 149 filling the contact holes CT may be formed on the lower contact patterns 145, respectively. For example, the upper contact patterns 149 may include at least one of a metal, a conductive metal nitride, or a doped semiconductor material. A conductive layer may be formed on the lower contact patterns 145 and then the conductive layer may be planarized to form the upper contact patterns 149 which are separated from each other and are disposed in the contact holes CT, respectively. As a result, a contact structure may be formed in each of the contact holes CT. The contact structure may include the pad pattern TP, the lower contact pattern 145, and the upper contact pattern which are sequentially stacked in the contact hole CT. The mask pattern 196 in the peripheral circuit region PCR may be removed.

Referring to FIGS. 1, 17A, 17B, and 17C, data storage parts may be provided to be connected to the upper contact patterns 149, respectively. In certain embodiments of the inventive concept implementing a dynamic random access memory (DRAM) device, the data storage parts may take the form of capacitors CAP. The capacitors CAP may include bottom electrodes BE, a top electrode TE, and an insulating layer DE between the top electrode TE and the bottom electrodes BE. In one particular embodiment, each of the bottom electrodes BE may have a cylindrical shape. In certain embodiments, a sacrificial layer may be formed on the substrate 100 having the upper contact patterns 149 and then be patterned to form node-holes exposing the upper contact patterns 149, respectively. A conductive layer may be conformally formed on the substrate 100 having the node-holes and then a filling layer may be formed on the conductive layer to fill the node-holes. The filling layer and the conductive layer may be planarized until the sacrificial layer is exposed, thereby forming the bottom electrodes BE separated from each other. Subsequently, the planarized filling layer and the sacrificial layer may be removed, and then the insulating layer DE and the top electrode TE may be sequentially formed on the bottom electrodes BE.

An upper insulating layer 119 may be formed on the substrate 100 in the peripheral circuit region PCR. A peripheral contact 186 may be formed to penetrate the upper insulating layer 119 and the interlayer insulating layer 113 in the peripheral circuit region PCR. The peripheral contact 186 may be connected to a third dopant region 23 formed in the peripheral active region at a side of the peripheral gate structure PG. A peripheral conductive line 185 may be formed on the peripheral contact 186. The peripheral conductive line 185 may be electrically connected to one of the bit line BL. However, the inventive concept is not limited thereto.

Another semiconductor device according to embodiments of the inventive concept will be described with reference to FIGS. 1, 17A, 17B, 17C, and 17D. Here, FIG. 17D is a plan view further illustrating a pad pattern and a spacer structure.

A substrate 100 including a cell array region CAR and a peripheral circuit region PCR may be provided. For example, the substrate 100 may be a semiconductor substrate formed of silicon, germanium, or silicon-germanium. Memory cells may be disposed in the cell array region CAR. A word line driver, a sense amplifier, row and column decoders, and control circuits may be disposed in the peripheral circuit region PCR. Device isolation layers 101 may be disposed in the substrate 100 to define first active regions AR1 in the cell array region CAR and a second active region AR2 in the peripheral circuit region PCR. The first active regions AR1 may have bar-shapes spaced apart from each other in a plan view. Each of the first active regions AR1 may extend in a direction s non-parallel and non-perpendicular to an x-axis direction and a y-axis direction in a plan view.

Dopant regions 21 and 22 may be formed in upper portions of the first active regions AR1. The dopant regions 21 and 22 may be doped with dopants of a conductivity type different from that of the substrate 100. A first dopant region 21 may be disposed between a pair of second dopant regions 22 in each of the active regions AR1. The first dopant region 21 and the second dopant regions 22 may be separated from each other by trenches 31 in each of the active regions AR1.

Cell gate structures may be buried in the substrate 100 of the cell array region CAR. The cell gate structures may be word lines WL. The word lines WL may be provided in the trenches 31, respectively. The word lines WL may extend in the y-axis direction. Each of the word lines WL may include a gate insulating layer 121, a gate electrode 126, and a gate capping pattern 129 which are sequentially stacked in each of the trenches 31.

Conductive lines may be provided on the substrate 100 of the cell array region CAR. The conductive lines may be connected to the first dopant regions 21 and extend in the x-axis direction. The conductive lines may be bit lines BL. A peripheral gate structure PG may be provided on the substrate 100 of the peripheral circuit region PCR. Each of the bit lines BL and the peripheral gate structure PG may include a first conductive pattern, a second conductive pattern, and a barrier pattern disposed between the first and second conductive patterns.

Spacer structures SPC may be provided on sidewalls of the bit lines BL. Each of the spacer structures SPC may include a first spacer 10 and a third spacer 12 sequentially stacked on the sidewall of the bit line BL. An air gap AG may be provided between the first spacer 10 and the third spacer 12. A sidewall and a bottom surface of the air gap AG may be defined by the first and third spacers 10 and 12, and a top surface of the air gap AG may be defined by a fourth spacer 15. A fifth spacer 16 may be provided on the fourth spacer 15. The air gap AG may be a region in which a solid phase material is not provided. In other words, the air gap AG may be a substantially empty space. The air gap AG has a dielectric constant lower than that of silicon oxide or silicon nitride. Thus, the air gap AG may minimize a parasitic capacitance influenced between the bit lines BL. As a result, it is possible to reduce a response time of the semiconductor device.

As illustrated in FIG. 17D, the air gap AG may be provided between the first spacer 10 and the third spacer 12, and a portion of the sidewall of the air gap AG may be defined by a second spacer 11. Alternatively, the second spacer 11 may be completely removed to extend under fence patterns 115.

A spacer structure may be provided on a sidewall of the peripheral gate structure PG. The spacer structure in the peripheral circuit region PCR may include a first spacer 10, a peripheral gate structure 13, a second spacer 11, and a third spacer 12 which are sequentially stacked on the sidewall of the peripheral gate structure PG. The spacer structure of the peripheral gate structure PG may not include the air gap differently from the spacer structure SPC of the bit line BL.

The fence patterns 115 may be provided to cross the bit lines BL in the cell array region CAR. The fence patterns 115 may extend along the word lines WL in the y-axis direction and be spaced apart from each other in the x-axis direction. In other words, the fence patterns 115 may have linear shapes in the cell array region CAR. The fence patterns 115 and the spacer structure SPC may define contact holes CT, and contact structures may be provided in the contact holes CT, respectively.

Each of the contact structures may include a pad pattern TP connected to the second dopant region 22 and extending along a sidewall of the contact hole CT. Each of the contact structures may further include a lower contact pattern 145 on the pad pattern TP. The pad pattern TP may extend along a bottom surface and a sidewall of the lower contact pattern 145. As illustrated in FIG. 17D, the pad pattern TP may include a bottom portion BP disposed under the lower contact pattern 145 and a pair of sidewall portion SP respectively connected to both edges of the bottom portion BP. In some embodiments, the pad pattern TP may have a cross section of a U-shape. The pair of sidewall portions SP may expose a portion of the sidewall of the lower contact pattern 145, and the portion of the sidewall of the lower contact pattern 145 exposed by the sidewall portions SP may be in contact with the fence patterns 115 as illustrated in FIG. 17B.

Each of the contact structures may be overlapped with the second dopant region 22 and the device isolation layer 101. A step SE may be formed at a boundary region between the second dopant region 22 and the device isolation layer 101. The pad pattern TP may be formed along the step SE. As a result, it is possible to increase a contact area between the pad pattern TP and the second dopant region 22.

Data storage parts may be provided to be electrically connected to the second dopant regions 22, respectively. For DRAM embodiments, the data storage parts may be capacitors CAP electrically connected to the second dopant regions 22. The capacitors CAP may include bottom electrodes BE, a top electrode TE, and an insulating layer DE between the top electrode TE and the bottom electrodes BE.

A peripheral contact 186 may penetrate an upper insulating layer 119 and an interlayer insulating layer 113 in the peripheral circuit region PCR. The peripheral contact 186 may be connected to a third dopant region 23 formed in the peripheral active region at a side of the peripheral gate structure PG. The peripheral contact 186 may be connected to a peripheral conductive line 185. The peripheral conductive line 185 may be electrically connected to one of the bit lines BL. However, the inventive concept is not limited thereto.

Figure 17A:
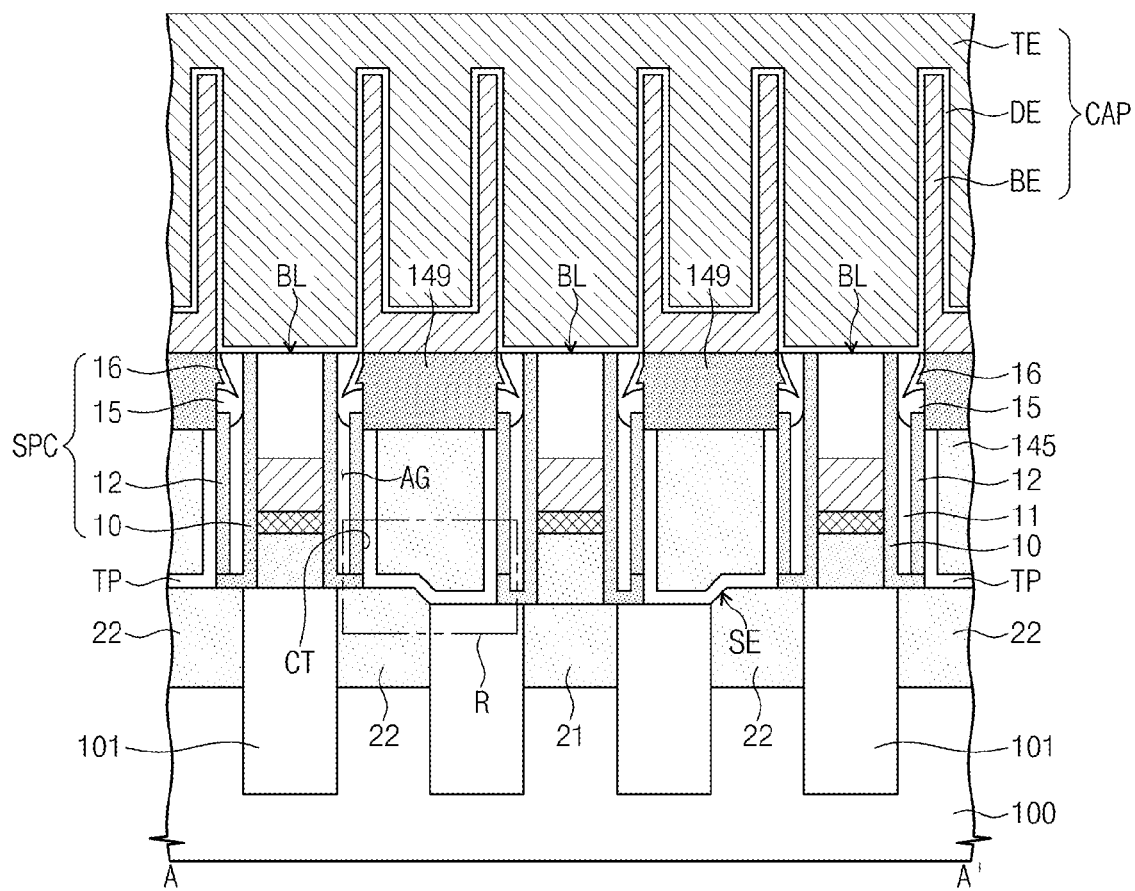
Figure 17B:
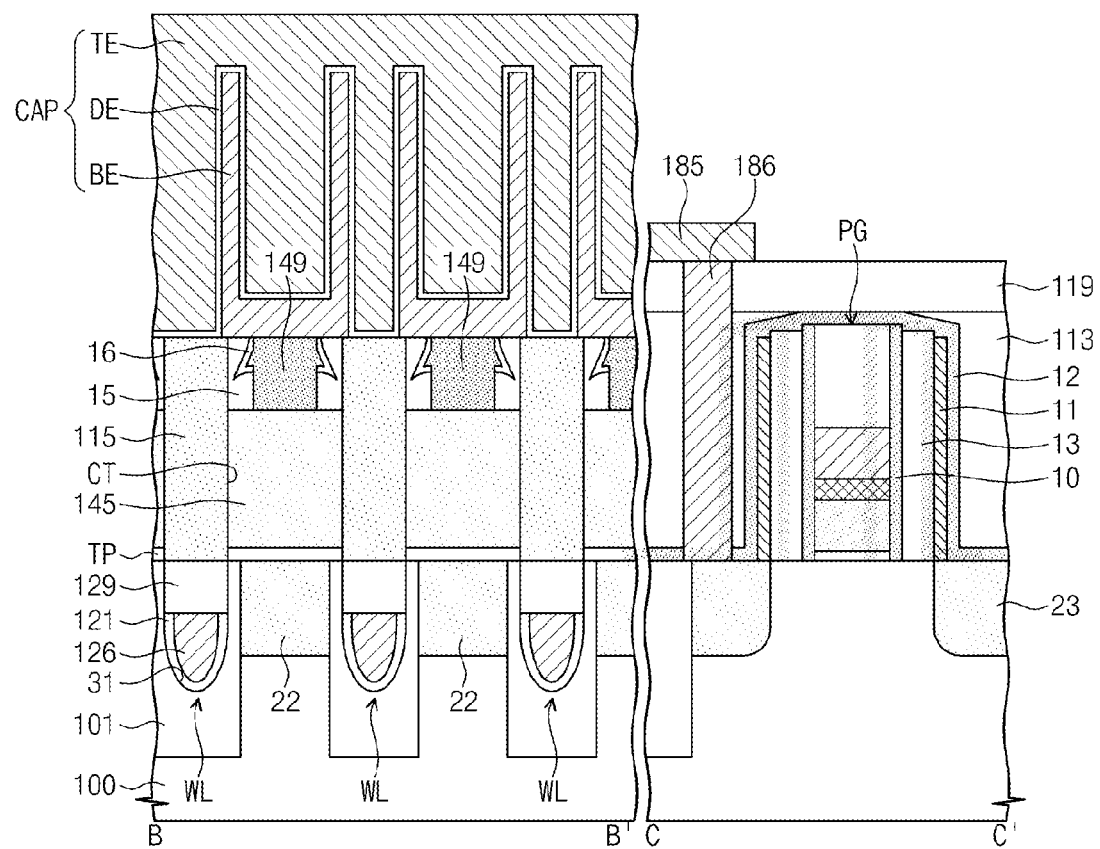
Figure 17C:
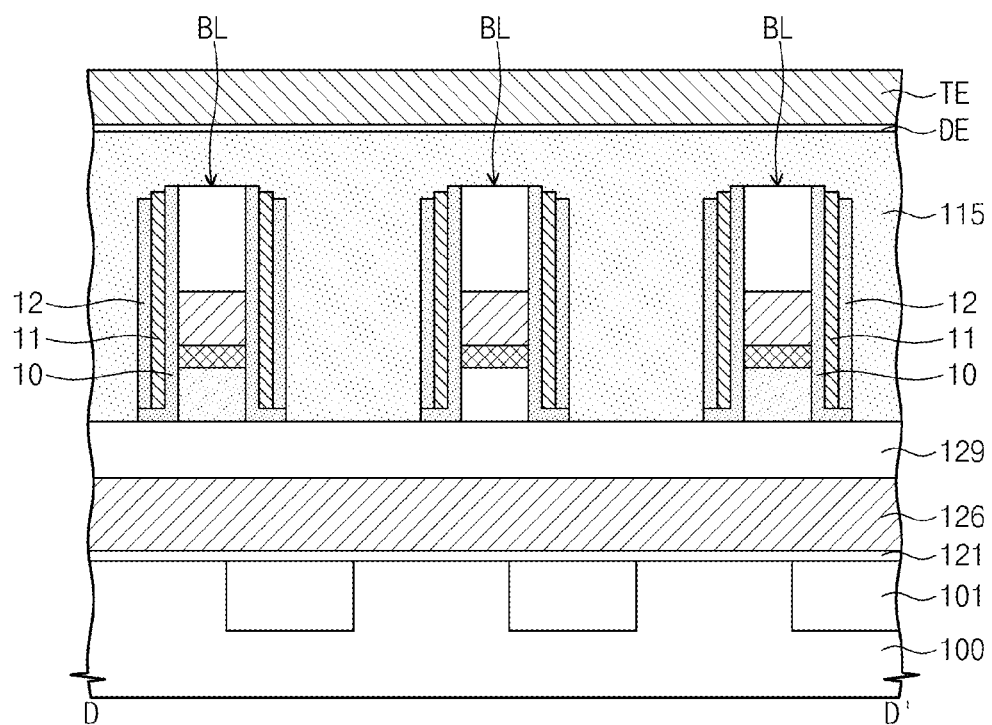
Figure 17D:
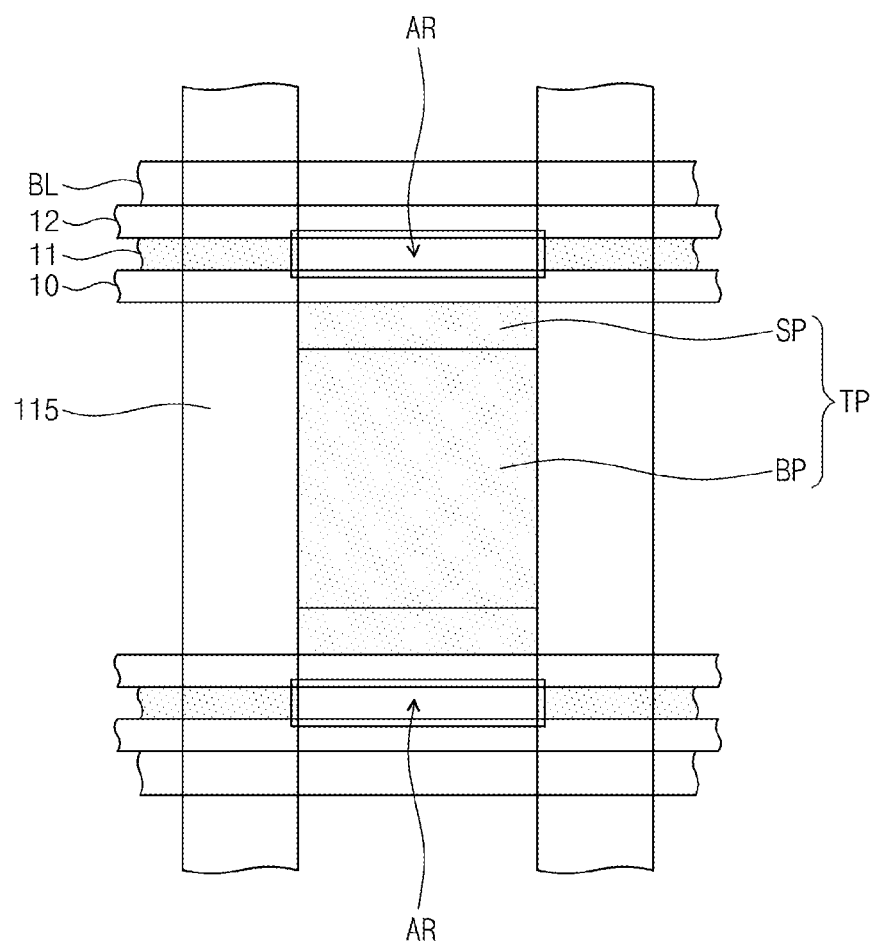
FIG. 17D is a plan view further illustrating a pad pattern and a spacer structure.
Figure 17E:
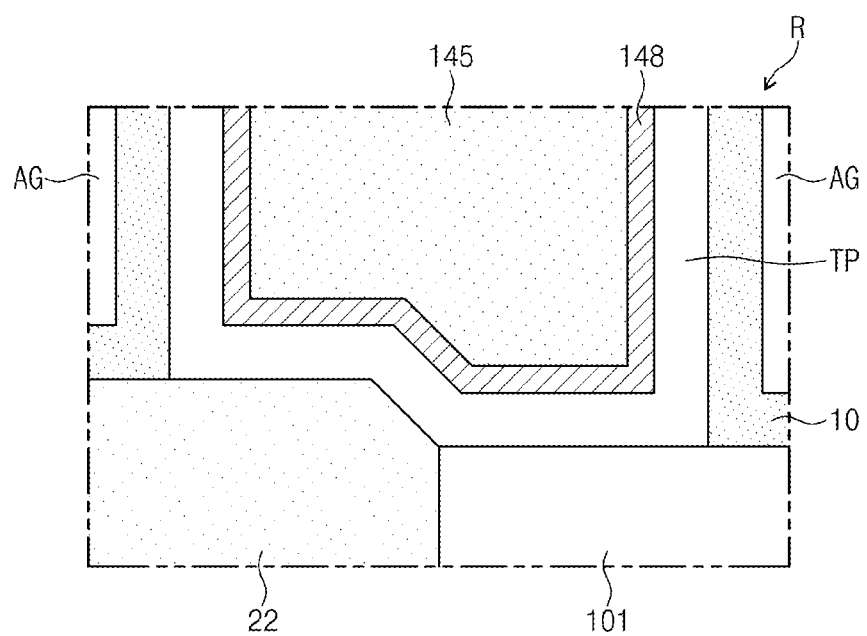
FIG. 17E is an enlarged view of region 'R' in FIG. 17A and serves to further illustrate one possible modification of a semiconductor device according to certain embodiments of the inventive concept.

FIG. 17E is an enlarged view of region 'R' of FIG. 17A and serves to further illustrate one possible modification of a semiconductor device according to certain embodiments of the inventive concept. In the modified example, each of the contact structures may further include a contact barrier layer 148 disposed between the pad pattern TP and the lower contact pattern 145. In some embodiments, if the lower contact pattern 145 includes a metal (e.g., titanium (Ti), tantalum (Ta), and/or tungsten (W)) and the pad pattern TP includes poly-crystalline silicon, the contact barrier layer 148 may include at least one of titanium nitride (TiN), tantalum nitride (TaN), or tungsten nitride (WN). In other embodiments, the pat pattern TP may include at least one of titanium (Ti), tantalum (Ta), or tungsten (W), and the contact barrier layer 148 may include at least one of titanium nitride (TiN), tantalum nitride (TaN), or tungsten nitride (WN).

According to certain embodiments of the inventive concept, the pad patterns TP are provided to be connected to the second dopant regions 22, respectively. The pad pattern TP may increase the contact area between the contact structure and the second dopant region 22. Thus, electrical characteristics of the semiconductor device may be improved. The pad pattern TP may be used as the etch stop layer in the formation process of the fence pattern. The air gap AG is provided in the spacer structure of the bit line BL, such that the parasitic capacitance between the bit lines BL may be minimized The semiconductor devices described above may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique. The package in which the semiconductor memory device according to one of the above embodiments is mounted may further include at least one semiconductor device (e.g., a controller and/or a logic device) that controls the semiconductor memory device.

Figure 18:
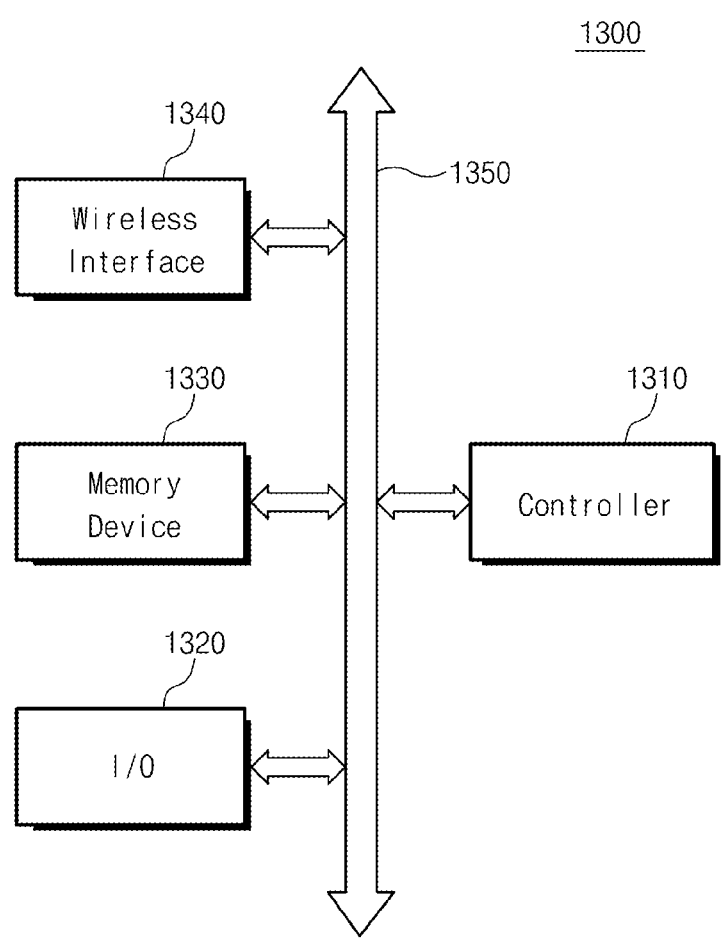
FIG. 18 is a block diagram of certain electronic devices that may incorporate one or more semiconductor device(s) according to embodiments of the inventive concept.

FIG. 18 is a block diagram of certain electronic devices that may incorporate one or more semiconductor devices according to embodiments of the inventive concept.

Referring to FIG. 18, an electronic device 1300 according to embodiments of the inventive concept may be one of a personal digital assistant (PDA), a laptop computer, a portable computer, a web tablet, a wireless phone, a mobile phone, a digital music player, a cable or wireless electronic device, and a complex electronic device including any combination thereof The electronic device 1300 may include a controller 1310, an input/output (I/O) unit 1320 (e.g., a keypad, a key board, and/or a display), a memory device 1330, and a wireless interface unit 1340 which communicate with each other through the data bus 1350. The controller 1310 may include at least one of a microprocessor, a digital signal processor, a microcontroller or other logic devices. The other logic devices may have a similar function to any one of the microprocessor, the digital signal processor and the microcontroller. The memory device 1330 may store user's data and/or commands. The memory device 1330 may include at least one of the semiconductor devices according to the embodiments described above. The electronic device 1300 may transmit data to a wireless communication network using a radio frequency (RF) signal and/or receive data from the network through the wireless interface unit 1340. For example, the wireless interface unit 1340 may include an antenna or a wireless transceiver. The electronic device 1300 may be used in a communication interface protocol such as CDMA, GSM, NADC, E-TDMA, WCDMA, and/or CDMA2000.

Figure 19:
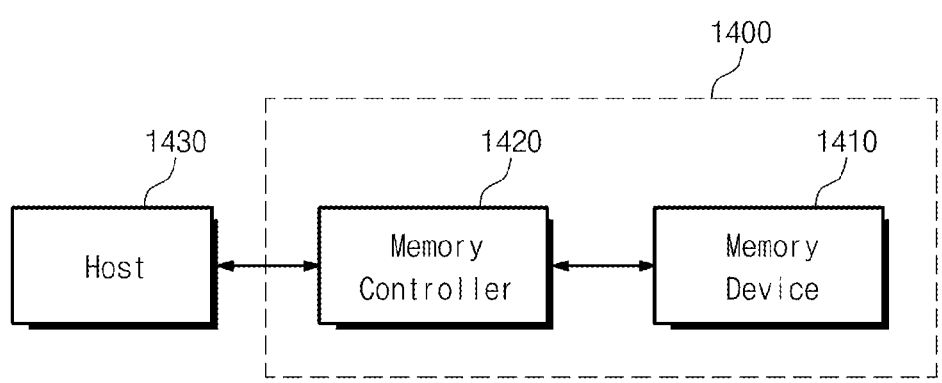
FIG. 19 is a block diagram of certain memory systems that may incorporate one or more semiconductor devices according to embodiments of the inventive concept.

FIG. 19 is a block diagram of memory systems that may incorporate one or more semiconductor devices according to embodiments of the inventive concept.

Referring to FIG. 19, the semiconductor devices according to the aforementioned embodiments may be used for realizing a memory system. The memory system 1400 may include a memory device 1410 and a memory controller 1420 for storing massive data. The memory controller 1420 may read data stored in the memory device 1410 or write data in the memory device 1410 in response to read/write request of a host 1430. The memory controller 1420 may constitute an address mapping table for mapping an address provided from the host 1430 (e.g., a mobile device or a computer system) into a physical address of the memory device 1410. The memory device 1410 may include at least one of the semiconductor devices according to the aforementioned embodiments.

According to embodiments of the inventive concept, it is possible to realize semiconductor devices having improved electrical characteristics. Highly integrated semiconductor devices may be provided.

While the inventive concept has been described with reference to example embodiments, it will be apparent to those skilled in the art that various changes and modifications may be made without departing from the scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited to only the foregoing description.

What is claimed is:

1. A semiconductor device comprising:
a gate structure;
a first dopant region and second dopant region disposed in a substrate on opposing ends of the gate structure;
a conductive line crossing the gate structure and electrically connected to the first dopant region;
a contact structure disposed in a contact hole provided between the conductive line and an exposed portion of the second dopant region,
wherein the contact structure includes:
a pad pattern having a bottom portion, and a pair of sidewall portions respectively extending from the bottom portion, and
a lower contact pattern disposed on the pad pattern, such that the pad pattern is provided along a bottom surface and a sidewall of the lower contact pattern;
a fence pattern provided on the substrate and crossing the conductive line, wherein a location of the contact hole is defined by the conductive line and the fence pattern, where a portion of the sidewall of the lower contact pattern contacts the fence pattern.

2. The semiconductor device of claim 1, wherein the pair of sidewall portions of the pad pattern expose a portion of the lower contact pattern.

3. The semiconductor device of claim 2, wherein the contact structure further comprises an upper contact pattern filling the contact hole on the lower contact pattern and top surfaces of the sidewall portions of the pad pattern contact the upper contact pattern.

4. The semiconductor device of claim 1, wherein the pad pattern includes poly-crystalline silicon.

5. The semiconductor device of claim 1, further comprising:
a device isolation layer defining active regions of the substrate, wherein the contact structure is overlapped by the device isolation layer and the second dopant region.

6. The semiconductor device of claim 5, wherein a bottom surface of the contact hole includes a step at a boundary region between the device isolation layer and the second dopant region.

7. The semiconductor device of claim 1, further comprising:
a data storage structure electrically connected to the contact structure.

8. The semiconductor device of claim 1, further comprising:
a spacer structure disposed between the conductive line and contact structure, wherein the spacer structure includes an air gap.

9. The semiconductor device of claim 8, wherein the spacer structure includes a first spacer and a second spacer sequentially stacked on a sidewall of the conductive line, and wherein the air gap is disposed between the first spacer and the second spacer.

10. The semiconductor device of claim 9, wherein a bottom surface of the air gap is defined by the first spacer.

11. The semiconductor device of claim 1, wherein the bottom portion includes a first bottom surface overlapping the second dopant region and a second bottom surface, wherein the first bottom surface is higher than the second bottom surface.

12. The semiconductor device of claim 1, further comprising:
a trench extending from an upper surface of the substrate, wherein the gate structure is disposed in the trench to partially fill the trench, such that an upper surface of the gate structure is disposed below the upper surface of the substrate.

13. A semiconductor device comprising:
a gate structure;
a first dopant region and second dopant region disposed in a substrate on opposing ends of the gate structure;
a conductive line crossing the gate structure and electrically connected to the first dopant region;
a contact structure disposed in contact hole provided between the conductive line and an exposed portion of the second dopant region, wherein the contact structure includes a pad pattern having a bottom portion and a pair of sidewall portions respectively extending from the bottom portion; and
a spacer structure disposed between the conductive line and contact structure, wherein the spacer structure includes an air gap.

14. The semiconductor device of claim 13, wherein the spacer structure includes a first spacer and a second spacer sequentially stacked on a sidewall of the conductive line, and wherein the air gap is disposed between the first spacer and the second spacer.

15. The semiconductor device of claim 14, wherein a bottom surface of the air gap is defined by the first spacer.

16. The semiconductor device of claim 13, wherein the contact structure further comprises a lower contact pattern disposed on the pad pattern, the pad pattern being provided along a bottom surface and a sidewall of the lower contact pattern.

17. The semiconductor device of claim 16, wherein a portion of the sidewall of the lower contact pattern contacts the fence pattern.

* * * * *